(12) United States Patent
McClellan et al.

(10) Patent No.: US 7,668,430 B2
(45) Date of Patent: Feb. 23, 2010

(54) TELECOMMUNICATIONS CHASSIS AND MODULE

(75) Inventors: Brian J. McClellan, Richfield, MN (US); Dale C. Madsen, Jordan, MN (US); Robin L. Berg, Jr., Shakopee, MN (US); Joseph S. Czyscon, Plymouth, MN (US); Steven W. Skradde, Lino Lakes, MN (US); Derek G. Sayres, Lonsdale, MN (US); Todd Husom, Crystal, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 671 days.

(21) Appl. No.: 11/000,363

(22) Filed: Nov. 29, 2004

(65) Prior Publication Data

US 2005/0135770 A1 Jun. 23, 2005

Related U.S. Application Data

(63) Continuation of application No. 09/873,763, filed on Jun. 4, 2001, now Pat. No. 6,824,312.

(51) Int. Cl.
*G02B 6/00* (2006.01)
(52) U.S. Cl. .................... 385/134; 385/135; 385/136; 385/137
(58) Field of Classification Search .......... 385/134–137
See application file for complete search history.

(56) References Cited

U.S. PATENT DOCUMENTS 5,459,808 A  10/1995  Keith
5,949,946 A * 9/1999  Debortoli et al. ............ 385/134
5,966,648 A  10/1999  Ortberg et al.
6,195,493 B1  2/2001  Bridges (Continued)

FOREIGN PATENT DOCUMENTS

DE   37 04 560 A1   8/1988

(Continued)

OTHER PUBLICATIONS

Fiber Panel Products—Specialty Panels; ADC Telecommunications, Jul. 1996, p. 73.

(Continued)

*Primary Examiner*—Jennifer Doan
(74) *Attorney, Agent, or Firm*—Merchant & Gould P.C.

(57) ABSTRACT

Telecommunications chassis and associated modules for use with the telecommunications chassis are disclosed. Embodiments of the telecommunications chassis include structures such as horizontal channels and/or horizontal surfaces with ridges and/or slots in one surface and slots in ridges of another for receiving edges of modules that mount within the chassis. Other structures of embodiments include divider slots in the horizontal surfaces that receive edges of divider walls to fix the divider walls in place, heat baffle surfaces included within the chassis, and/or cable guides with radius limiters. Module embodiments include structures such as faceplates with angled portions with fiber optic cable connections directed toward the fiber cable's direction of travel. Other module structures include shells that enclose the circuit board and/or provide angled portions with fiber optic cable connections. Module embodiments may also include circuitry for converting electrical signals to optical and optical signals to electrical, and the circuitry may selectively operate at multiple data rates.

26 Claims, 34 Drawing Sheets

U.S. PATENT DOCUMENTS

| | | | |
|---|---|---|---|
| 6,208,796 B1 | 3/2001 | Williams Vigliaturo | |
| 6,211,779 B1 * | 4/2001 | Gibb et al. | 340/466 |
| 6,305,848 B1 | 10/2001 | Gregory | |
| 6,388,891 B1 | 5/2002 | Falkenberg et al. | |
| 6,424,781 B1 | 7/2002 | Puetz et al. | |
| 6,537,106 B1 | 3/2003 | Follingstad | |
| 6,614,979 B2 | 9/2003 | Bourdeau | |
| 6,616,344 B1 * | 9/2003 | Van Deventer | 385/88 |
| 6,824,312 B2 | 11/2004 | McClellan et al. | |
| 6,856,769 B1 * | 2/2005 | Steffensen et al. | 398/135 |
| 7,224,947 B2 * | 5/2007 | Sit et al. | 455/90.3 |

FOREIGN PATENT DOCUMENTS

| | | |
|---|---|---|
| WO | WO 99/63628 | 12/1999 |
| WO | WO 00/52504 | 9/2000 |

OTHER PUBLICATIONS

HWX Receiver Modules—Forward Path and Dual Return Path Receivers; ADC Telecommunications; Dec. 1998, pp. 1-6.
DV6000 Universal Digital Transmission System; DV6000 Repeater Shelf and Controller; ADC Video Systems.
DV6000 Universal Digital Transmission System; DV-6120-DS Dual Optical Switch; ADC Video Systems.
DV6000 Dense Wavelength Division Multiplexing (DWDM) with DV6000; ADC Telecommunications; Jun. 1997, pp. 1-4.
Homeworx Transport Platform; Targeted Services Distribution Shelf; ADC Video Systems.
Homeworx HWX Transmission System; HWX 1550 nm Transmitter and Amplifier; ADC Broadband Communications.
PxPlus Dsl Digital Signal Cross-Connect; ADC Telecommunications; Jan. 1997; pp. 1-12.
Chassis—Loaded; ADC Telecommunications; Jul. 1998; p. 7-8.
Rear Cross-Connect; Unloaded Chassis; ADC Telecommunications; Jun. 1997; pp. 10.
Front Cross-connect; Modules, unloaded Chassis, ADC Telecommunication; Jun. 1997 p. 16, 17.
Soneplex Broadband System; ADC Telecommunications; Feb. 1998; pp. 1-4.
Soneplex HDSL 239 Repeater; ADC Telecommunications.
Homeworx HWX Transmission Systems; HWX 1310/1550 nm Equipment Shelf; ADC Broadband Communications.
23-Inch Soneplex Loop Extender Chassis Slots; ADC Telecommunications, Inc.; Issue 6, May 2000, p. 1-3; 2-37, 38.
ADTRAN's Fiber Products.
TC Communications Fiber Optic Connectivity; T3/E3 Fiber Optic Modem; www.tccomm.com/TC1680.htm; last modified Jun. 21, 2000.
DS3/T3 Fiber Optic Links, Versitron; DS3/T3 Point-to-Point Fiber Optic Link.
VLM-700 DS3/E3 Fiber Optic Modem; Versa Technology, Inc.
Extend Broadband E3, T3 & STS-1 Service Over fiber-Quickly and Economically; Optical/Electrical Converter Module for the BCS II; Telect, Inc.; www.telect.com; Oct. 2000.
32 Position Optical Transport System.
BCS II Optical-Electrical Converter Module; www.telect.com.
OCU 45 T3/E3/STS-1 Fiber Modem; ADTRAN; www.adtran.com; Dec. 2000.
OCU 45 T3/E3/STS-1 Fiber Modem; ADTRAN; www.adtran.com; pp. 1-4.
FOM II Modems Technical Data; FOM II Series Model F2300 Group DS3 Interface Extenders; Versitron; www.versitron.com.
Versa Technology, Inc.; VLM-700 features; www.versatek.com.
Versa Technology, Inc.; VLM-700 specifications; www.versatek.com.
TC Communications; T3/E3 Fiber Optic Modems; www.tccomm.com/TC1680; last updated May 2, 2001.
TC Communications; T3/E3 Fiber Optic Modem; Model TC 1680; www.tccomm.com.
TDK Semiconductor Corporation; DS3/E3/STS-1 Fiber Optic Reference Design; Apr. 1999.
ADC Telecommunications, Inc.; DS3 (B2 FC/SC) Fiber Loop Converter User Manual; Aug. 1998, pp. 1-49.

* cited by examiner

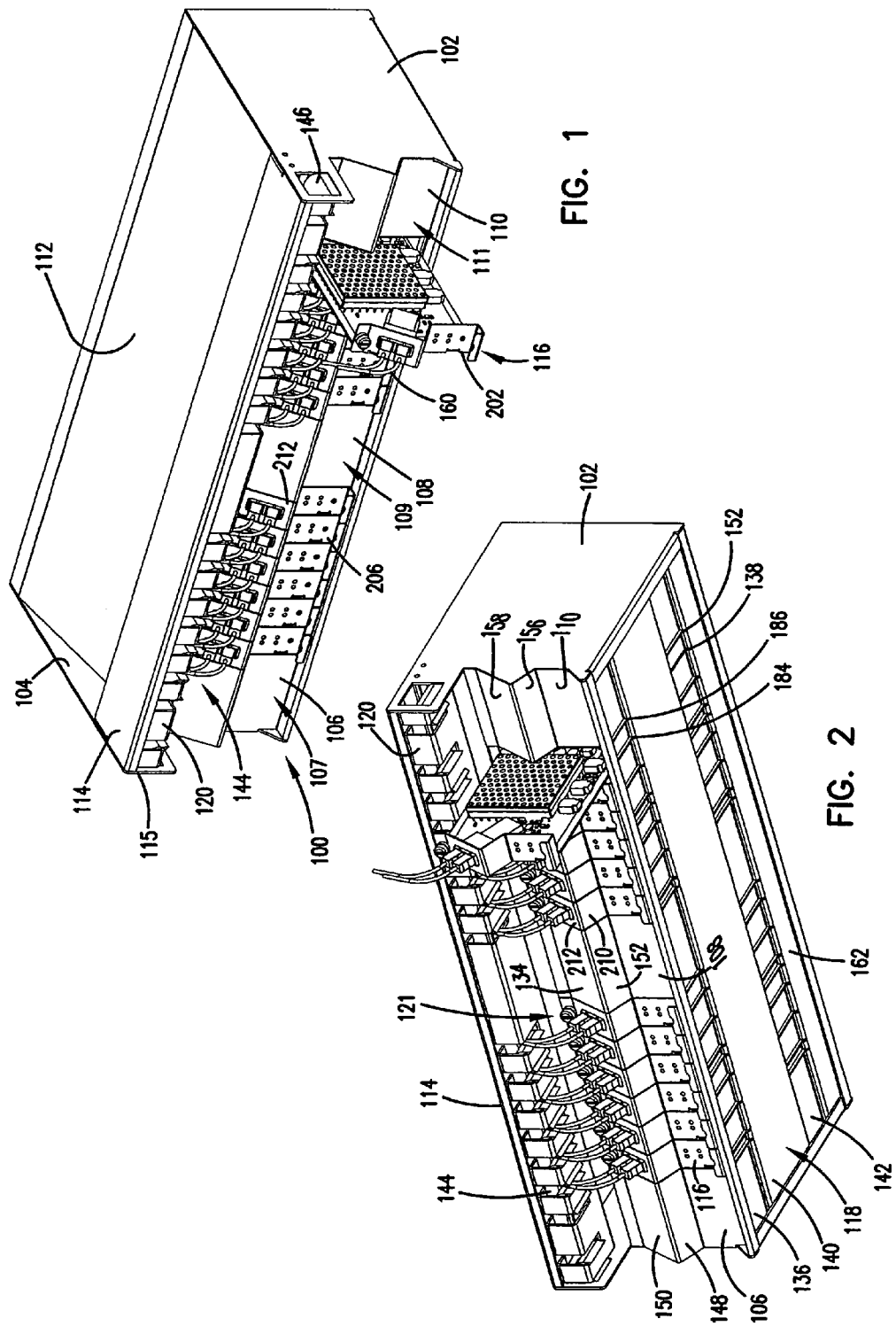

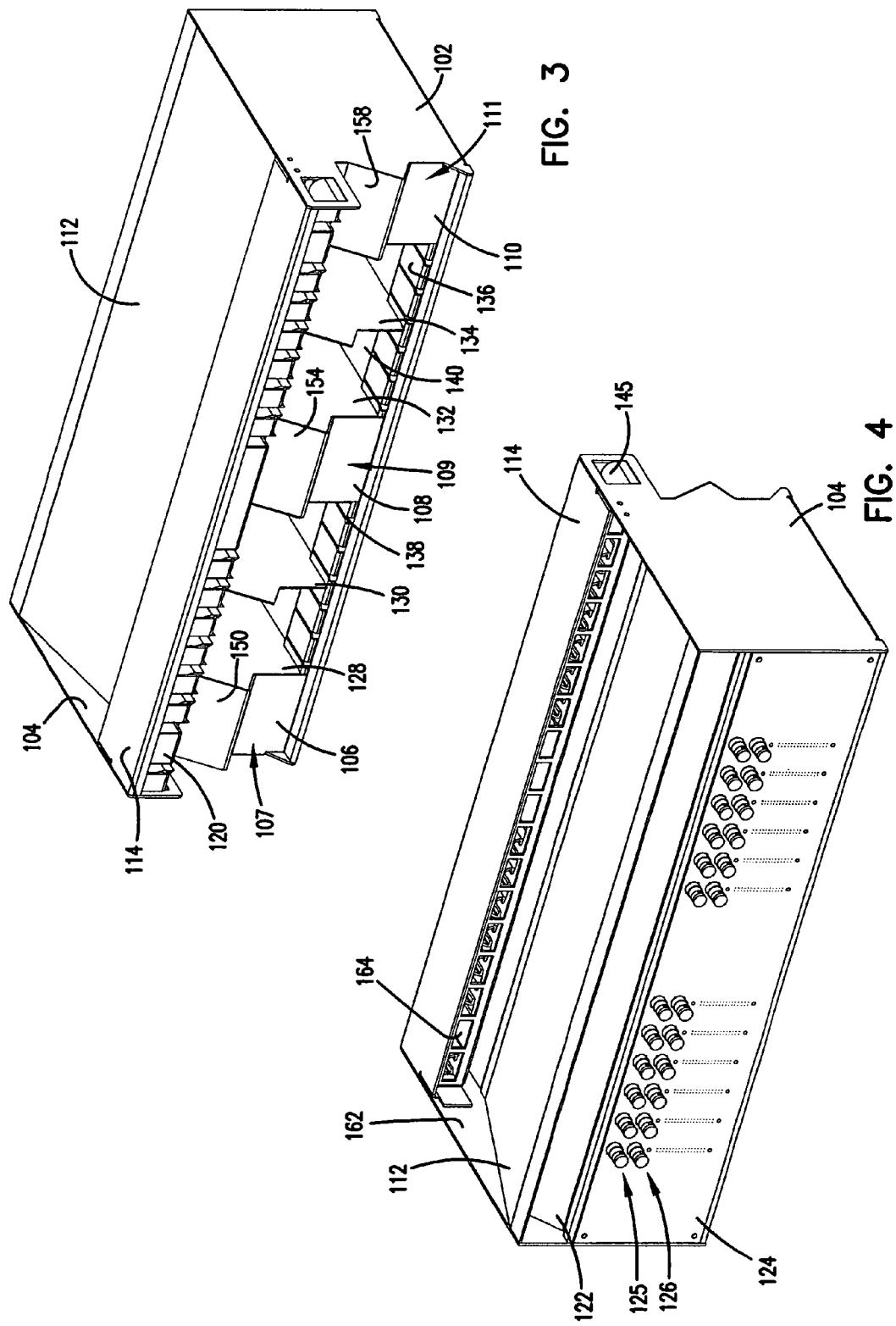

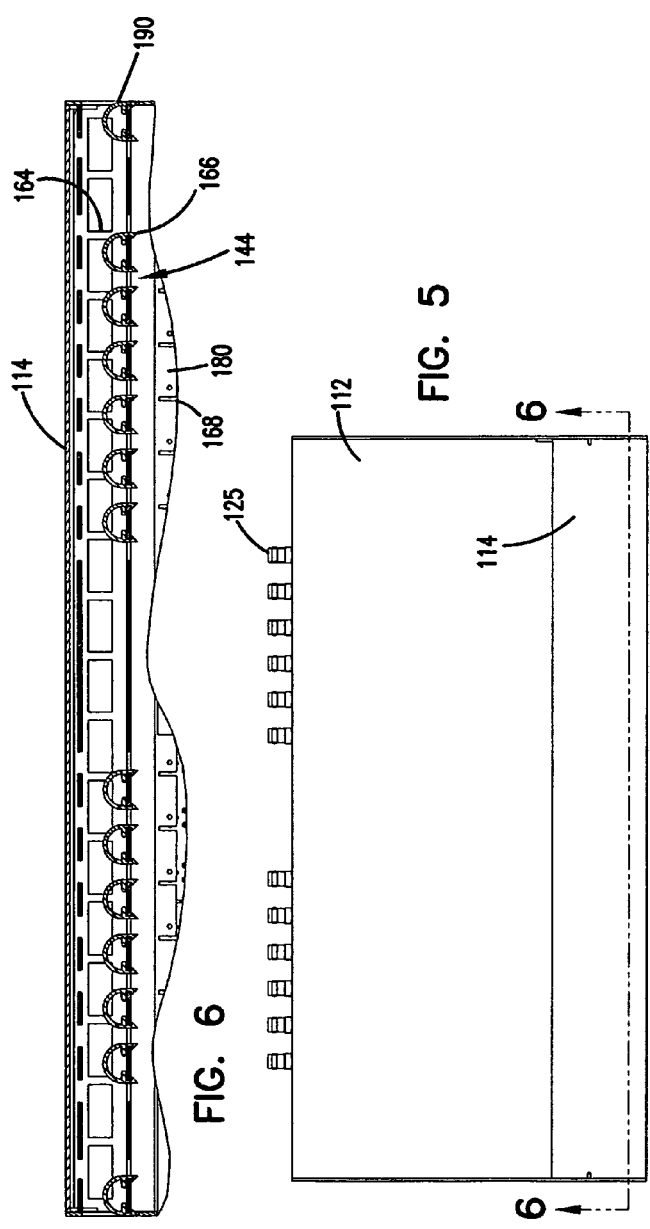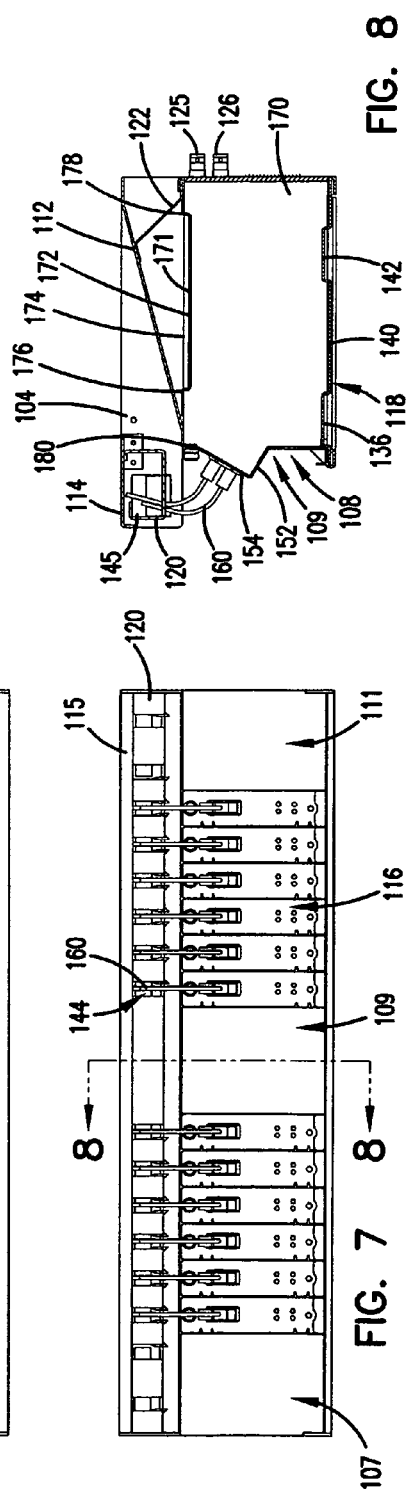

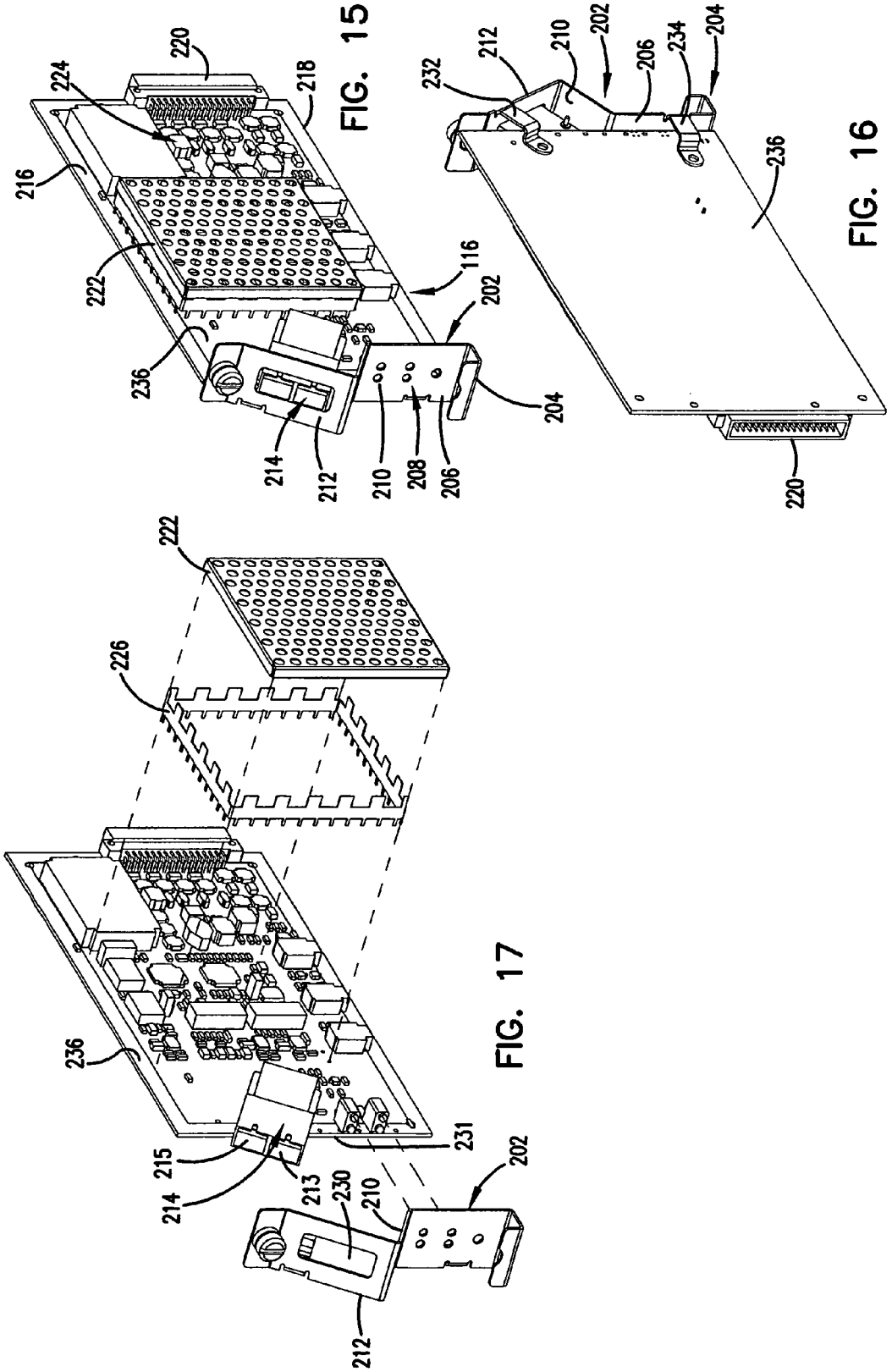

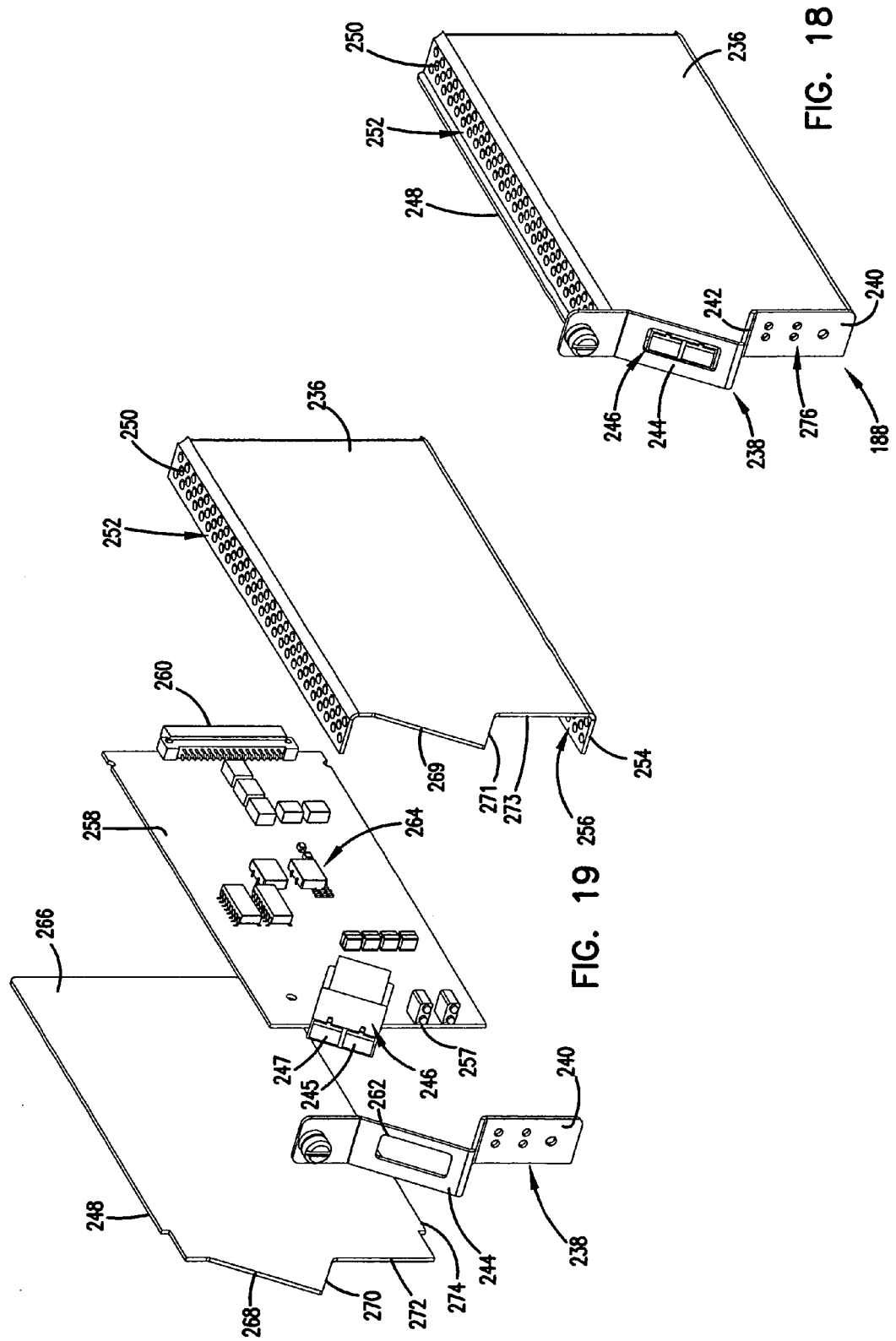

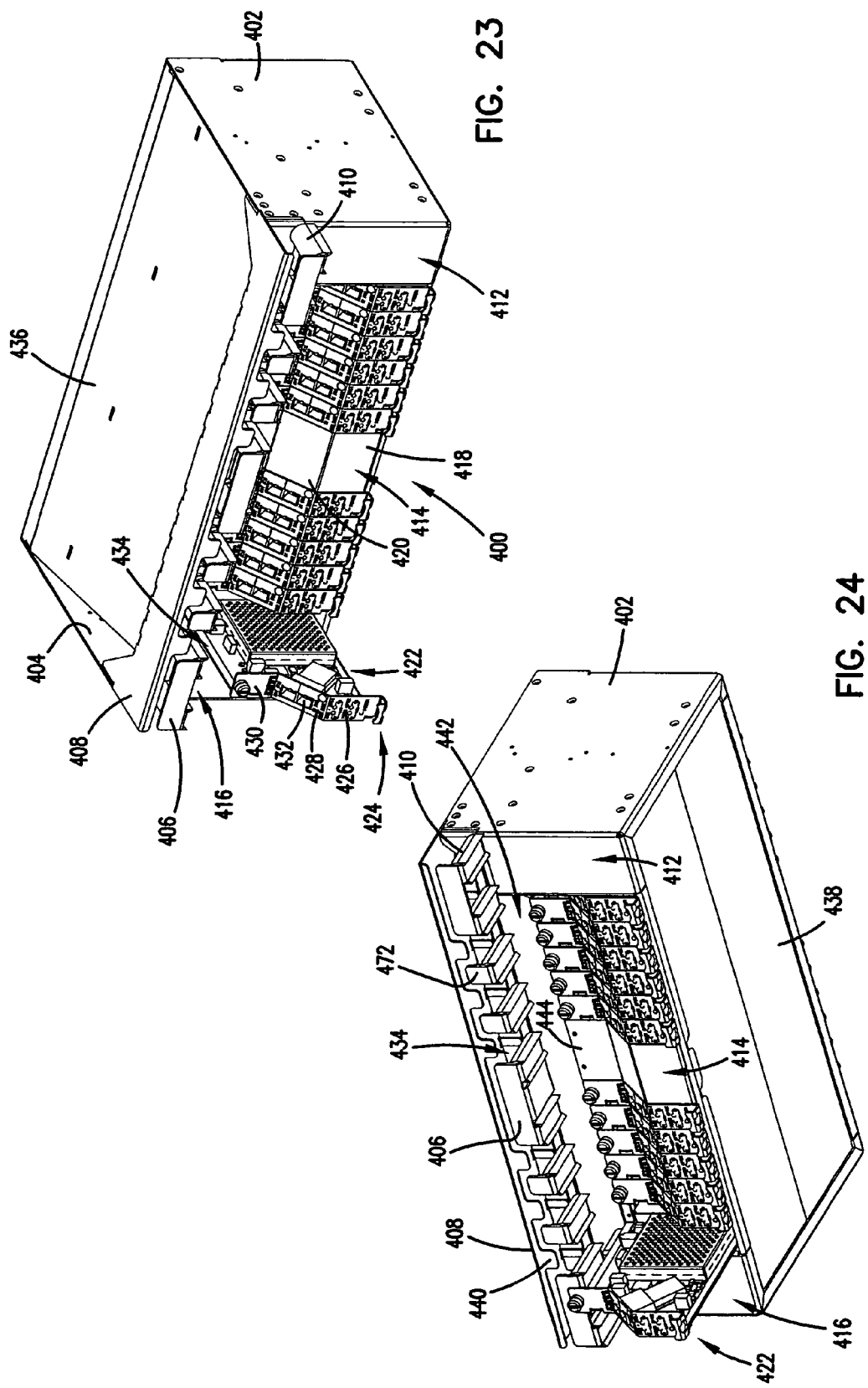

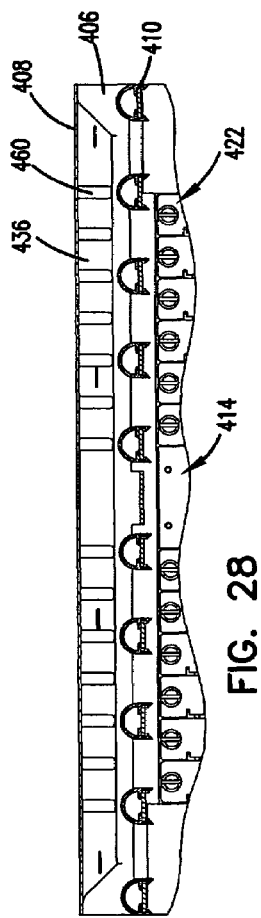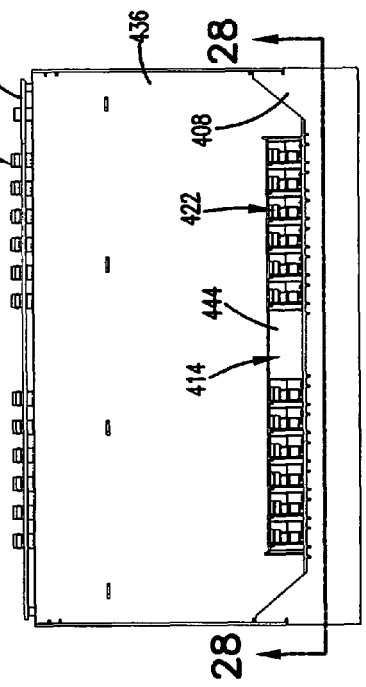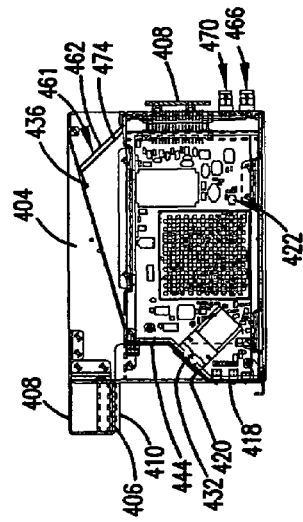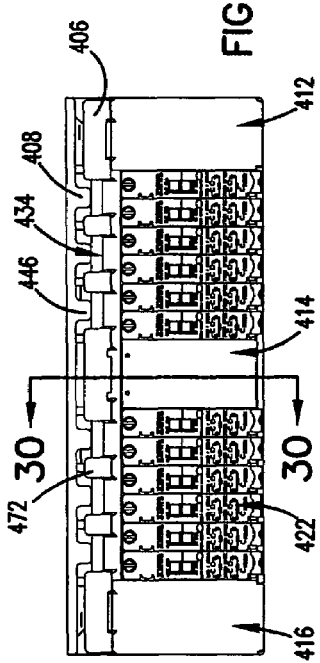
FIG. 28
FIG. 27
FIG. 29
FIG. 30

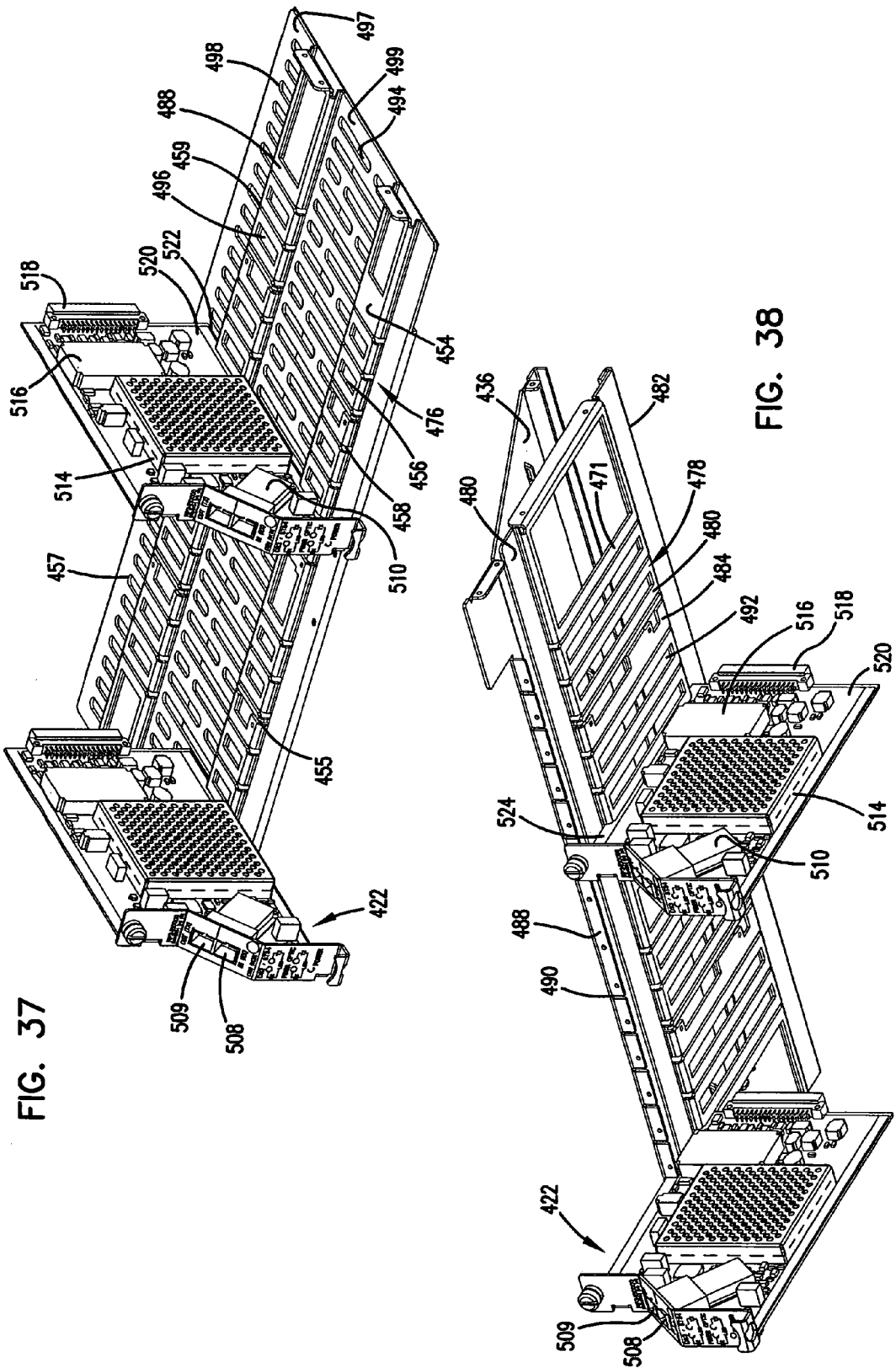

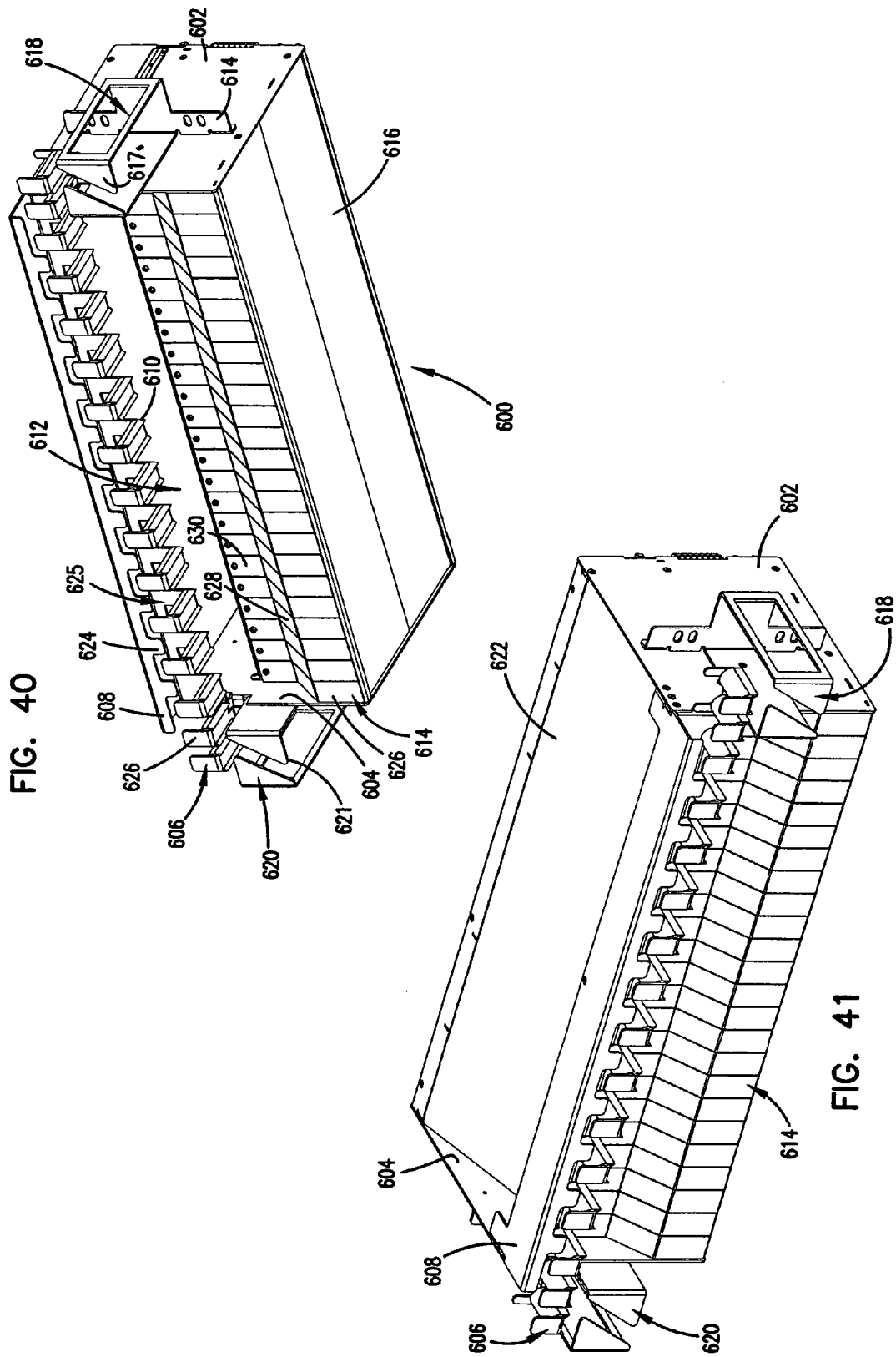

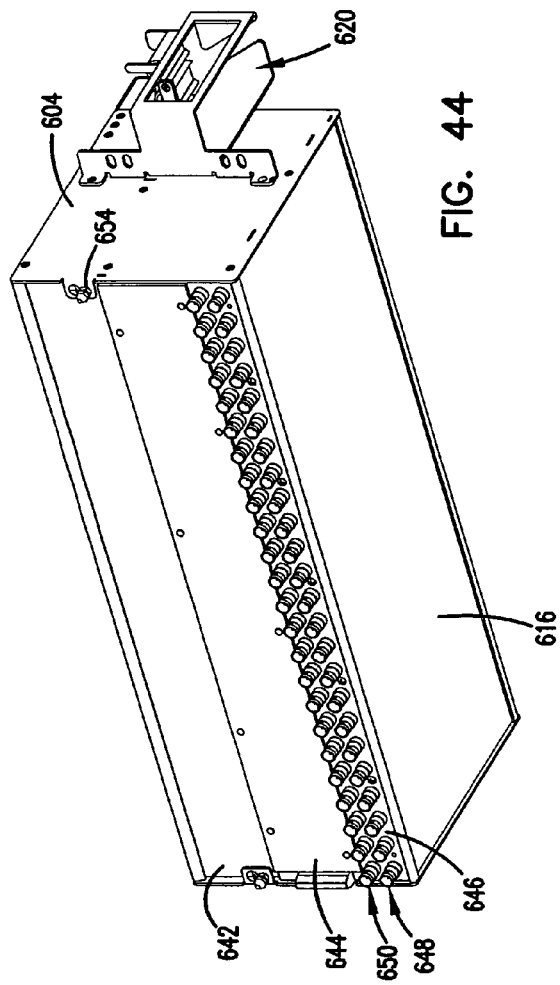
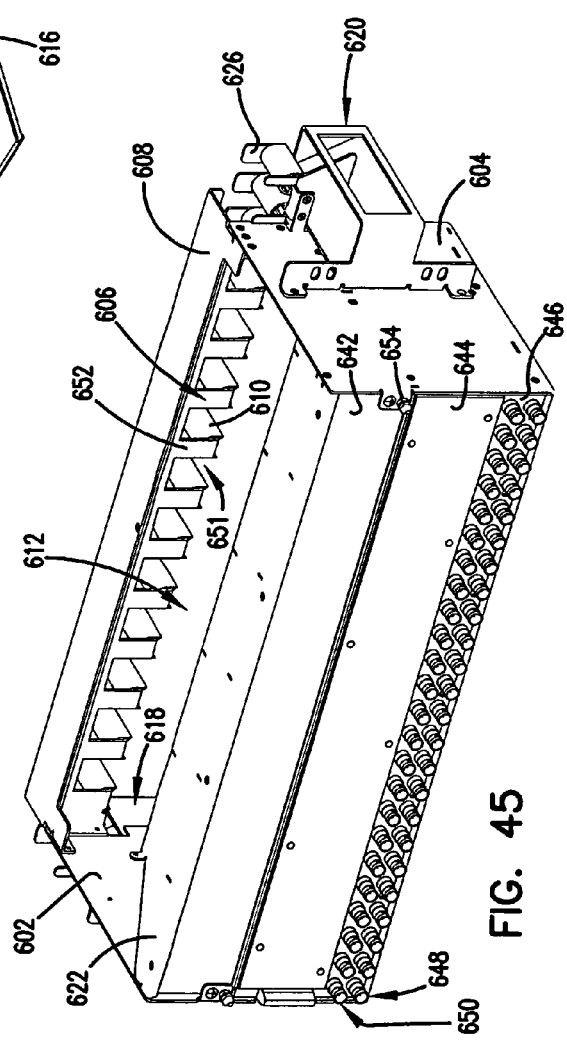

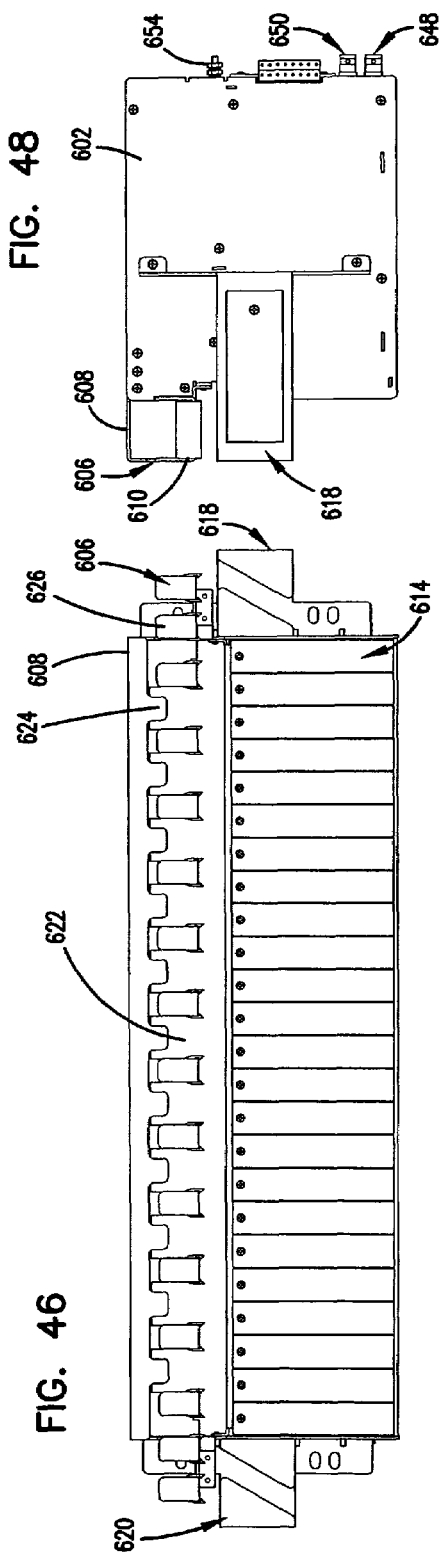
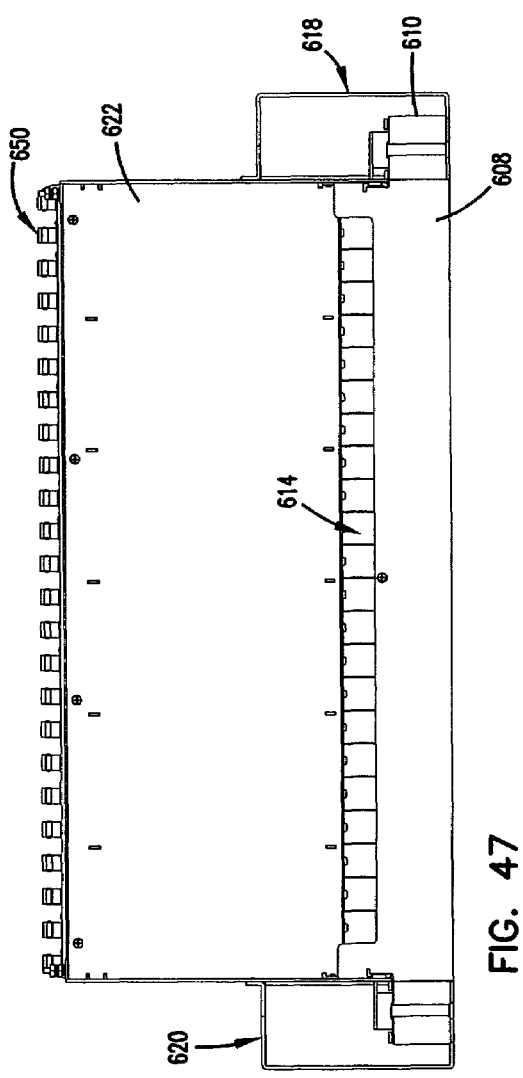

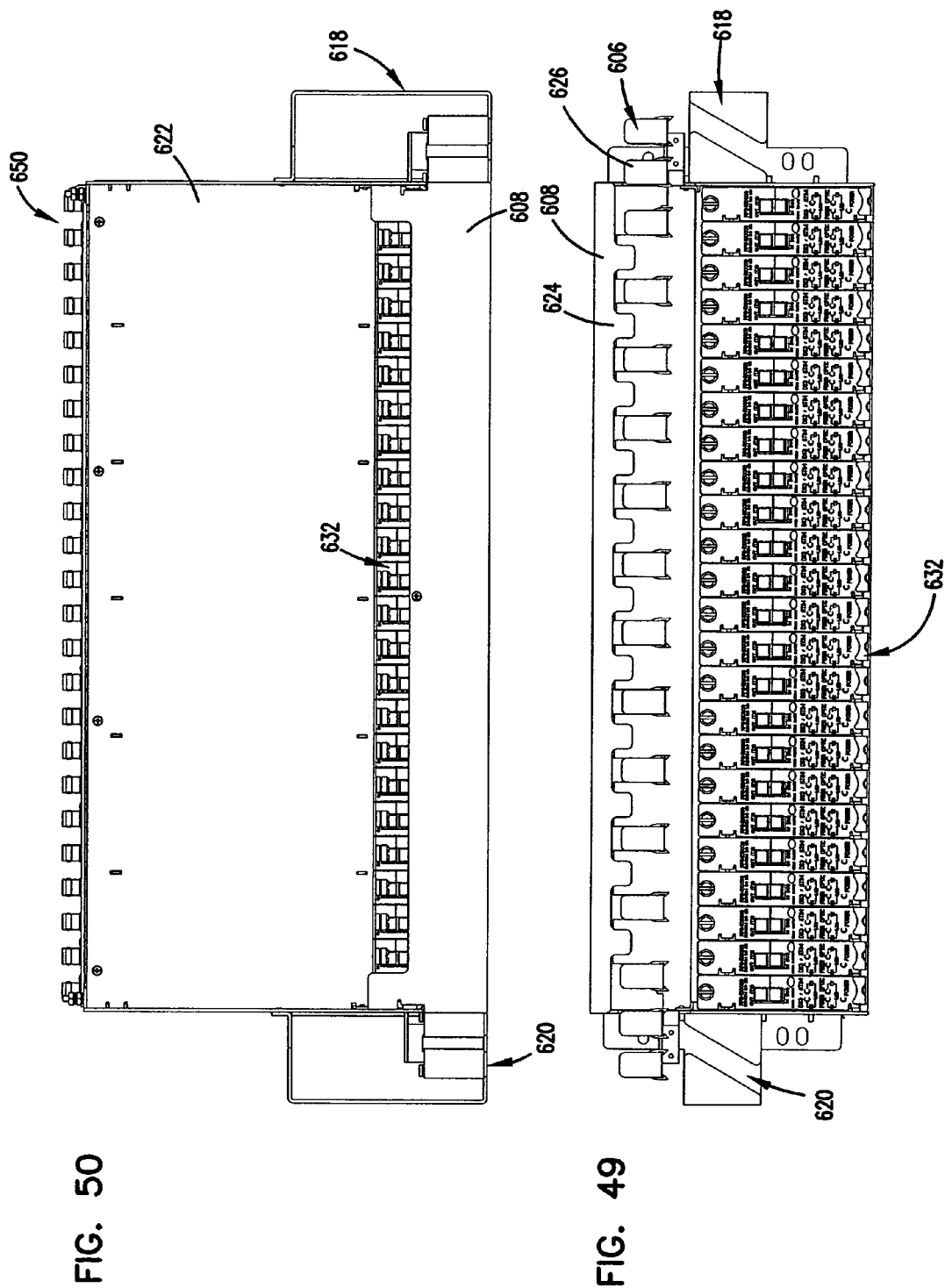

TELECOMMUNICATIONS CHASSIS AND MODULE

CROSS-REFERENCE TO RELATED APPLICATIONS

This application is a Continuation of U.S. patent application Ser. No. 09/873,763, filed on Jun. 4, 2001 now U.S. Pat. No. 6,824,312, which application is incorporated herein by reference.

TECHNICAL FIELD

The present invention is directed to telecommunications chassis and associated modules. More specifically, the present invention is directed to chassis and module structures that facilitate high-density mounting and/or facilitate electrical to optical signal conversion.

BACKGROUND

Chassis for housing telecommunications modules provide a structure for protecting the modules from externalities while providing heat dissipation for circuitry contained on the modules and while shielding the modules from electromagnetic interference. Furthermore, a chassis may be required to control flame spread should a fire ever be imposed within the chassis. In the case of modules that have fiber optic cable connections, the chassis additionally may be required to accommodate and manage fiber cables connected to one or more modules. These fiber cables must maintain a bend radius of greater than a certain amount to prevent fiber breaks and/or signal attenuation.

As the density of modules within a given chassis volume increases, the functions expected of the chassis generally become more difficult to accomplish. The number of heat generating components increases while the spacing between modules decreases. Additionally, a greater number of data signals pass through the chassis presenting a higher signal vulnerability and likelihood of signal cross-talk. Specifically, when the modules have fiber cable connections, the chassis must manage a greater number of cables, and the likelihood of overbending one or more of the cables increases.

Chassis that can accommodate a high density of modules with the ability to convert electrical signals to optical and optical to electrical are useful in various applications. For example, electrical to optical and optical to electrical conversion are useful in applications where signals arrive in electrical media but must be distributed over distances greater than is possible over a continuous electrical conductor. Signals may only be transferred relatively limited distances on electrical conductors due to attenuation before repeaters must be introduced to reconstruct the signal. However, fiber conductors can carry a signal over distances many times greater than electrical conductors. Therefore, applying an electrical to optical conversion for a signal prior to distribution and then optical to electrical conversion near the destination eliminates the need for the interposed repeater circuits. Also, employing one large diameter fiber optic cable reduces the clutter that would result from the many coaxial cables that would be necessary.

Generally, these conversions must be done for a large number of communications channels, as is the case when providing communications within a high-rise building where the electrical to optical conversion occurs at the ground floor and optical signals are distributed to the various floors of the building. In such an environment, it is generally desirable to minimize the clutter of equipment so module density within a chassis may be relatively high. Furthermore, some applications require conversions for one data rate while other applications require conversions at another data rate. Thus, there is a need for chassis and module structures that facilitate a high density of telecommunications circuits, including those performing electrical to optical and optical to electrical conversions at one or more data rates.

SUMMARY

Embodiments of the present invention provide structures that enable a relatively high density of circuits to be contained on modules housed within a chassis. Embodiments provide module mounting structures and ventilation structures to dissipate heat developed by the circuitry within the chassis, but control the spread of flames should a fire be imposed. Structures for managing cables and preventing overbending are also provided for both chassis and module embodiments. Embodiments also provide modules with circuitry for converting signals from electrical to optical or optical to electrical at multiple data rates.

The present invention may be viewed as a chassis for holding telecommunications cards. The chassis includes first and second horizontal surfaces and vertical sidewalls mounted to the first and second horizontal surfaces. The first horizontal surface has a first ridge positioned substantially perpendicular to a longitudinal axis of the vertical sidewalls, and the first horizontal surface also has a plurality of card slots extending across the first horizontal surface but not across the first ridge. The card slots are substantially parallel to a longitudinal axis of the vertical sidewalls. The second horizontal surface has a first ridge with a plurality of card slots extending across the first ridge of the second horizontal surface that are substantially parallel to the plurality of card slots of the first horizontal surface.

The present invention may be viewed as another chassis for holding telecommunications cards. The chassis includes first and second horizontal surfaces and vertical sidewalls mounted to the first and second horizontal surfaces. The first horizontal surface has a first portion with a plurality of card slots, and the plurality of card slots extend across the first portion to an edge of the first horizontal surface and are substantially parallel to a longitudinal axis of the vertical sidewalls. The first horizontal surface also has a divider slot between adjacent card slots, and the divider slot is substantially parallel to the plurality of card slots of the first horizontal surface but does not extend to the edge of the first horizontal surface.

The present invention may be viewed as a telecommunications module. The module includes a circuit board that has a first edge. A fiber optic cable connector is mounted to the circuit board along the first edge, and the fiber optic cable connector has a cable connection axis forming an angle with the first edge. At least a portion of the fiber optic cable connector extends beyond the first edge. A faceplate is mounted to the circuit board, and the faceplate has a first portion substantially parallel to the first edge, a second portion substantially parallel to the connection axis of the fiber optic cable connector, and a third portion substantially perpendicular to the connection axis of the fiber optic cable connector. Circuitry is included on the circuit board for converting electrical signals to optical signals or optical signals to electrical signals.

The present invention may be viewed as another telecommunications module. The module includes a circuit board containing circuitry for transferring signals, and the circuit board has a first edge. A fiber optic cable connector is mounted to the circuit board along the first edge, and the fiber optic cable connector has a connection axis forming an angle with the first edge. A shell including first and second sidewalls separated by first and second horizontal surfaces and by a first vertical surface is included. The circuit board and the fiber optic cable connector are mounted within the shell between the first and second sidewalls and between the first and second horizontal surfaces, and the first vertical surface has a first portion substantially parallel to the first edge of the circuit board, a second portion substantially parallel to the connection axis of the fiber optic cable connector, and a third portion substantially perpendicular to the connection axis of the fiber optic cable connector. The first and second sidewalls abut the first portion, second portion, and third portion of the first vertical surface. The module also has a connector mounted to the printed circuit board that extends beyond the shell.

The present invention may be viewed as another chassis for holding telecommunications modules. The chassis includes first and second horizontal surfaces and vertical sidewalls mounted to the first and second horizontal surfaces. A first cover surface that is substantially perpendicular to the vertical sidewalls is positioned between the first and second horizontal surfaces, and the first cover surface has a first substantially vertical portion, a second portion angled with respect to the first substantially vertical portion, and a third portion angled with respect to the first substantially vertical first portion and substantially perpendicular to the second portion.

The present invention may be viewed as another chassis for holding telecommunications modules. The chassis includes first and second vertical sidewalls and first and second horizontal surfaces mounted to the first and second vertical sidewalls. A first baffle surface is disposed between the first and second vertical sidewalls, and the first baffle surface is substantially perpendicular to the first and second vertical sidewalls and is angled with respect to the first and second horizontal surfaces.

The present invention may be viewed as another chassis for holding telecommunications modules. The chassis includes first and second horizontal surfaces and vertical sidewalls mounted to the first and second horizontal surfaces. A cable guide is mounted to the first horizontal surface or the first and second vertical sidewalls, and the cable guide has a horizontal portion, a vertical portion, and a plurality of cable slots. A plurality of radius limiters is disposed within the cable guide with each radius limiter being adjacent to one of the plurality of cable slots.

The present invention may be viewed as another telecommunications module. The module includes a circuit board containing circuitry for transferring signals, the circuit board having a first edge with a first portion, a second portion, and a third portion. The module also includes a fiber optic cable connector mounted to the circuit board along the second portion. The fiber optic cable connector has a connector axis perpendicular to the second portion, with the second portion being angled with respect to the first portion and the third portion. The second portion interconnects the first portion to the third portion, and the first portion and the third portion are parallel but within a different spatial plane.

The present invention may be viewed as a telecommunications module that includes an optical connector and circuitry connected to the optical connector. The circuitry is configured to selectively convert electrical signals having a first data rate or electrical signals having a second rate different than the first rate to optical signals. The present invention may also provide for more than two data rates.

The present invention may be viewed as a telecommunications module that includes an optical connector and circuitry connected to the optical connector. The circuitry is configured to selectively convert optical signals to electrical signals having a first data rate or to electrical signals having a second data rate different than the first data rate. The present invention may also provide for more than two data rates.

The present invention may be viewed as another chassis for holding telecommunications modules. The chassis includes first and second horizontal surfaces and vertical sidewalls mounted to the first and second horizontal surfaces. A first cover surface is substantially perpendicular to the vertical sidewalls and disposed between the first and second horizontal surfaces. The first cover surface has a first substantially vertical portion, a second portion angled with respect to the first portion, and a third substantially vertical portion, and the second portion interconnects the first portion and the third portion. A second cover surface is spaced horizontally from the first cover surface and is substantially perpendicular to the vertical sidewalls and between the first and second horizontal surfaces. The second cover surface has a first substantially vertical portion, a second portion angled with respect to the first portion, and a third substantially vertical portion, wherein the second portion interconnects the first portion and the third portion. An opening to the interior of the chassis is defined by the first cover surface, second cover surface, and first and second horizontal surfaces.

The present invention may be viewed as another chassis for holding telecommunication modules. The chassis includes a first horizontal surface and vertical sidewalls mounted to the first horizontal surface. The first horizontal surface has a first ridge positioned substantially perpendicular to a longitudinal axis of the vertical sidewalls, and the first horizontal surface has a second ridge positioned substantially parallel to but spaced from the first ridge. The first horizontal surface also has a plurality of card slots extending across at least a portion of the first horizontal surface, and the card slots are substantially parallel to a longitudinal axis of the vertical sidewalls. The first and second ridges have at least one opening between adjacent card slots. The chassis also includes a plurality of modules positioned between the vertical sidewalls and on the first horizontal surface. The plurality of modules have an edge disposed in the card slot of the first horizontal surface and have circuitry for converting electrical signals to optical or optical signals to electrical signals. The circuitry includes an optics transceiver positioned over the first ridge and a DC-DC converter positioned over the second ridge.

The present invention may be viewed as another chassis for holding telecommunications modules. The chassis includes a horizontal surface having a width of a first dimension and first and second vertical walls mounted to horizontal surface. The first and second vertical sidewalls form spatial planes parallel to the first dimension. The chassis also includes a horizontal channel extending between the first and second vertical sidewalls and spaced from the horizontal surface. The horizontal channel has a plurality of horizontal card slots extending parallel to the spatial planes of the vertical sidewalls, and the horizontal channel has a width of the first dimension less than the width of the first dimension of the horizontal surface.

The present invention may also be viewed as another chassis for holding telecommunications modules. The chassis includes a horizontal surface and first and second vertical walls mounted to the horizontal surface. The chassis also includes a first baffle surface disposed between the first and second vertical walls, and the baffle surface forms an angle relative to the horizontal surface. One or more vertical divider walls are disposed between the first and second vertical walls, and the one or more vertical divider walls have a first edge parallel to the baffle surface and a second edge parallel to the horizontal surface.

DESCRIPTION OF THE DRAWINGS

FIG. 1 is a top front perspective view of a loaded chassis according to one embodiment of the present invention.

FIG. 2 is bottom front perspective view of the loaded chassis.

FIG. 3 is a top front perspective view of the empty chassis.

FIG. 4 is a top rear perspective view of the empty chassis.

FIG. 5 is a top view of the loaded chassis.

FIG. 6 is a cross-sectional front view taken through line A-A of FIG. 5.

FIG. 7 is a front view of the loaded chassis.

FIG. 8 is a cross-sectional side view taken through line B-B of FIG. 7.

FIG. 15 is a top front perspective view of a module according to one embodiment of the present invention.

FIG. 16 is a top rear perspective view of the module.

FIG. 17 is an exploded perspective view of the module.

FIG. 18 is a top front perspective view of an alternative module according to an embodiment of the present invention.

FIG. 19 is an exploded perspective view of the alternative module.

FIG. 23 is a top front perspective view of a loaded chassis according to a second alternative embodiment of the present invention.

FIG. 24 is bottom front perspective view of the loaded chassis of FIG. 23.

FIG. 25 is a top front perspective view of the empty chassis of the second alternative embodiment.

FIG. 26 is a top rear perspective view of the empty chassis of FIG. 25.

FIG. 27 is a top view of the loaded chassis of FIG. 23.

FIG. 28 is a cross-sectional front view taken through line AA of FIG. 27.

FIG. 29 is a front view of the loaded chassis of FIG. 23.

FIG. 30 is a cross-sectional side view taken through line B-B of FIG. 29.

FIG. 37 is a perspective view of the modules mounted with respect to a bottom horizontal surface of the second alternative embodiment.

FIG. 38 is a perspective view of the modules of FIG. 37 mounted with respect to a top horizontal surface of the chassis of FIG. 23.

FIG. 40 is a bottom front perspective view of an empty chassis according to third alternative embodiment of the present invention.

FIG. 41 is a top front perspective view of the empty chassis of FIG. 40.

FIG. 44 is a bottom rear perspective view of the empty chassis of FIG. 40.

FIG. 45 is a top rear perspective view of the empty chassis of FIG. 40.

FIG. 46 is a front view of the empty chassis of FIG. 40.

FIG. 47 is a top view of the empty chassis of FIG. 40.

FIG. 48 is a right side view of the empty chassis of FIG. 40.

FIG. 49 is a front view of the loaded chassis of FIG. 42.

FIG. 50 is a top view of the loaded chassis of FIG. 42.

DETAILED DESCRIPTION

Figure 10:
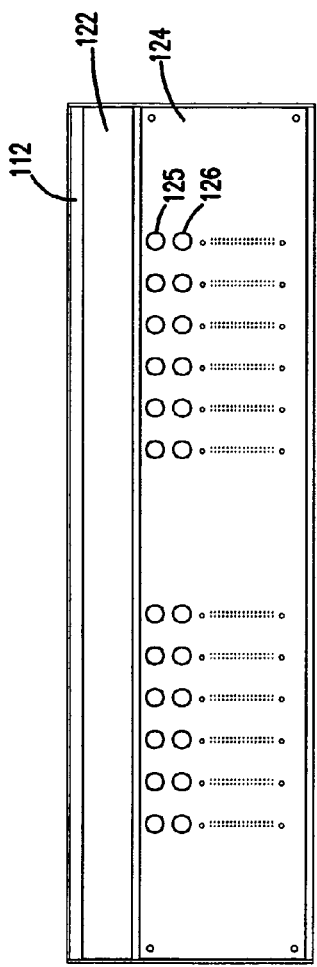
FIG. 10 is a rear view of the empty chassis.

Various embodiments of the present invention will be described in detail with reference to the drawings, wherein like reference numerals represent like parts and assemblies through the several views. Reference to various embodiments does not limit the scope of the invention, which is limited only by the scope of the claims attached hereto.

FIGS. 1 and 2 show an embodiment of a loaded chassis 100 in accordance with the present invention. The chassis 100 includes vertical sidewalls 102, 104 made of metal such as cold-rolled steel with a chromate plating and includes a baffle surface 112 positioned between the vertical sidewalls 102, 104 and made of a material such as cold-rolled steel or aluminum. The baffle surface 112 is substantially perpendicular to the plane created by either sidewall 102, 104. The solid baffle surface 112 prevents heat and/or flames from passing into areas above the chassis 100. However, a gap 121 shown in FIG. 2 allows air to pass into the area above the baffle surface 112 such as for providing ventilation to areas above the chassis 100. The chassis embodiment shown is equipped to house modules 116 that engage fiber optic cables 160.

A cable guide 120 is mounted between the vertical sidewalls 102, 104 and receives the fiber optic cables 160 that extend from the modules 116. The cable guide 120 has slots 144 that allow the cables 160 to enter the cable guide 120. The vertical sidewalls 102, 104 have cable exit holes 145, 146 located to the sides of the cable guide 120 that allow the fiber optic cables 160 to exit the cable guide 120 and chassis 100. The cable guide 120 has a cover 114 positioned over the cavity of the cable guide 120 to prevent the fiber cables 160 from protruding above the chassis 100. The cover 114 has a lip 115 extending from the front edge and abutting the cable guide 120 that further maintains the cover's 114 alignment with the cable guide 120.

The chassis embodiment shown includes two groups of modules 116 and three empty chambers on each side of the two groups of modules 116. The empty chambers permit the chassis 100 to accommodate a certain number of modules 116 with a cumulative width significantly less than the width required of the chassis 100 for mounting in a given rack. The three empty chambers each have a front cover that is flush with the faceplate 202 of the modules 116 that is made of a metal such as cold-rolled steel with a chromate plating.

The leftmost chamber includes front cover 107 which includes a substantially vertical portion 106, a second portion 148 angled with respect to the vertical portion 106, and a third portion 150 that is substantially perpendicular to the second portion 148 and angled with respect to the vertical portion 106. The center chamber includes front cover 109 which includes a substantially vertical portion 108, a second portion 152 angled with respect to the vertical portion 108, and a third portion 154 that is substantially perpendicular to the second portion 152 and angled with respect to the vertical portion 108. The rightmost chamber includes front cover 111 which includes a substantially vertical portion 110, a second portion 156 angled with respect to the vertical portion 110, and a third portion 158 that is substantially perpendicular to the second portion 156 and is angled with respect to the vertical portion 110.

The faceplate 202 of modules 116 of FIGS. 1 and 2 has a first substantially vertical portion 206 that is aligned and flush with the first substantially vertical portion 106, 108, or 110 when the module 116 is fully inserted into the chassis 100. The faceplate 202 also has a second portion 210 angled with respect to the first substantially vertical portion 206 that is aligned and flush with the second portion 148, 152, or 156 when the module 116 is fully inserted into the chassis 100. The faceplate 202 also has a third portion 212 that is substantially perpendicular to the second portion 210 and is angled with respect to the vertical portion 206. The third portion 212 is aligned and flush with the third portion 150, 154, or 158.

Providing the angled second and third portions on the modules 116 permit fiber optic cable connections to be provided at an angle to prevent overbending of the cables 160. The angled second and third portions on the front covers 107, 109, and 111 protect the interior of the chassis 100 and circuitry of the modules 116 by creating a seamless barrier together with the faceplate 202 of each module 116. The modules 116 and faceplate 202 will be discussed in more detail below.

As can be seen in FIG. 2, the chassis 100 includes a horizontal surface 118 forming a bottom to the chassis 100. The horizontal surface 118 which may also be made of a metal such as cold-rolled steel with a chromate plating includes a first ridge 136 extending perpendicular to the plane of the vertical sidewalls 102, 104. Specifically, the ridge 136 is perpendicular to a horizontal longitudinal axis of the vertical sidewalls 102, 104 that runs from the front of the chassis 100 to the rear. A second ridge 142 that is substantially parallel to the first ridge 136 is also included in the horizontal surface 118. A recessed area 140 between the first ridge 136 and second ridge 142 is also included, as is a recessed area 162 between the back edge of the horizontal surface 118 and the second ridge 142. As shown below with reference to other embodiments, the bottom horizontal surface 118 may include ventilation holes to allow air to enter the interior of the chassis 100. Alternatively, the horizontal surface 118 may be made of a mesh material with densely populated openings.

The first ridge 136 has card slots 184 that receive edges of the modules 116. Each card slot 184 is perpendicular to the first ridge 136. The first ridge 136 also has divider slots 186 that divider wall edges are located within. Similarly, the second ridge 142 has card slots 138 that are linear in relation to the card slots 184 of the first ridge 136. The second ridge 142 also has divider slots 182 that are linear in relation to the divider slots 186 located in the first ridge 136.

FIG. 3 shows the empty chassis 100. The divider walls 128, 130, 132, and 134 can be seen located between card slots 138. The divider walls 128, 130, 132, and 134 compartmentalize the interior of the chassis 100 and may be made of a material such as cold-rolled steel or aluminum. Should a fire be imposed within the interior of the chassis 100, compartmentalization prevents the flames from spreading. As can be seen, the divider walls 128, 130, 132, and 134 have multiple front edges that abut the various portions of the front covers 107, 109, and 111 and/or various portions of the module faceplates 202.

The horizontal surface 118 can be seen between the divider walls 128, 130, 132, and 134. The divider walls 128, 130, 132, and 134 fit into the divider slots 186 and 182 in the first ridge 136 and second ridge 142 between the card slots 138 and 184. As can be seen, the divider walls 128, 130, 132, and 134 and the divider slots 186 do not extend fully across the first ridge 136. The divider walls 128, 130, 132, and 134 abut the end of the divider slots 186 within the first ridge 136 and are held in place.

FIG. 4 shows the rear of the chassis 100. The chassis 100 includes a backplane 124 that is typically a printed circuit board. The backplane has a plurality of coaxial input jacks 125 and output jacks 126 for sending and receiving electrical signals. The position of the jacks 125, 126 could be swapped so that either the input or output jack is the top jack. A second heat baffle surface 122 can also be seen. The second heat baffle surface 122 is typically a mesh piece of metal such as aluminum having about 60% of its surface occupied by densely spaced holes. The second baffle surface acts as a flame diffuser to prevent flames that are directed out of the top of the chassis 100 from easily exiting out of the back of the heat baffle. The second heat baffle surface 122 allows heat to be dissipated from the heat baffle.

Also shown in FIG. 4 are ventilation holes 164 in the cable guide 120. These ventilation holes 164 allow air to pass from beyond the front of the chassis 100 through the cable guide 120 to the area above heat baffle surface 112. The air may then rise through a ventilated bottom surface of a chassis mounted atop chassis 100, such as when chassis are installed in a rack. This concept is shown in more detail with reference to a different chassis embodiment in FIG. 36.

FIG. 5 shows a top view of the chassis 100 including the cable guide cover 114 and heat baffle surface 112. The input coaxial jacks 125 can also be seen. FIG. 6 shows a cross-sectional front view of the cable guide 120 taken through line A-A of FIG. 5. Radius limiters 166 are located within the cable guide 120 and are adjacent to the cable guide slots 144. The radius limiters 166 have a radius that is large enough to prevent overbending of fiber optic cables 160 routed over the curved surface of the radius limiter 166. Other radius limiters 190 are located at the outer edges of the cable guide 120 to prevent overbending of fiber optic cables 160 as they are routed out of the cable guide and up or down the rack containing the chassis 100. The cable guide 120 and cable guide cover 114 may be made of a rigid material such as metal. The radius limiters 166 and 190 may also be made of a rigid material including metal or plastic.

As shown in FIG. 6, the heat baffle surface 112 has a front lip 180 that contains card slots 168 for receiving the edge of the modules 116 as they are inserted. The cable guide 120 also has a rear portion with the holes 164 that allow air to pass over the region above the heat baffle surface 112. As discussed, when chassis 100 is rack mounted, passing air into the region above the baffle surface 112 allows the air to pass into the bottom of the chassis mounted above to ventilate the circuitry contained by the modules 116 of the chassis 100 above.

FIG. 7 shows a front view of the chassis 100. As can be seen, each cable guide slot 144 is aligned with a module 116 such that the fiber optic cable 160 passes vertically from the module 116 to a cable slot 144. FIG. 8 shows a cross-sectional side view taken through line B-B of FIG. 7. Divider wall 170, located between divider walls 130 and 132 is visible in this view. The fiber optic cable 160 passes from the angled portion 212 of the module 116, which is flush with portion 154 of front cover 109, up through the cable guide 120.

The vertical portion 108 of the front cover 109 can be seen in relation to angled portion 152 and 154. Angled portion 152 is substantially perpendicular to angled portion 154. As discussed below, creating the perpendicular angle on the module that is flush with angled portions 152 and 154 permit the connection axis of a fiber optic cable connector of the module 116 to be angled toward the cable guide 120 to reduce the likelihood of overbending the cables 160.

Also shown in FIG. 8 are the ridges 136 and 142 and recessed area 140 between the ridges in the bottom horizontal surface 118. Additionally, the angle between the heat baffle surface 112 and a top horizontal surface 172 can be seen. The top horizontal surface 172 includes a recessed area 171 and a first ridge 176 extending perpendicular to the vertical sidewalls 102, 104 and a second ridge 178 that is substantially parallel to the first ridge 176. The top horizontal surface 172 may be made of metal such as cold-rolled steel with a chromate plating and may contain ventilation holes as shown below for other embodiments or may be a mesh metal. The second baffle surface 122 can also be seen in FIG. 8 extending from the first baffle surface 112 to the top horizontal surface 172.

Figure 9:
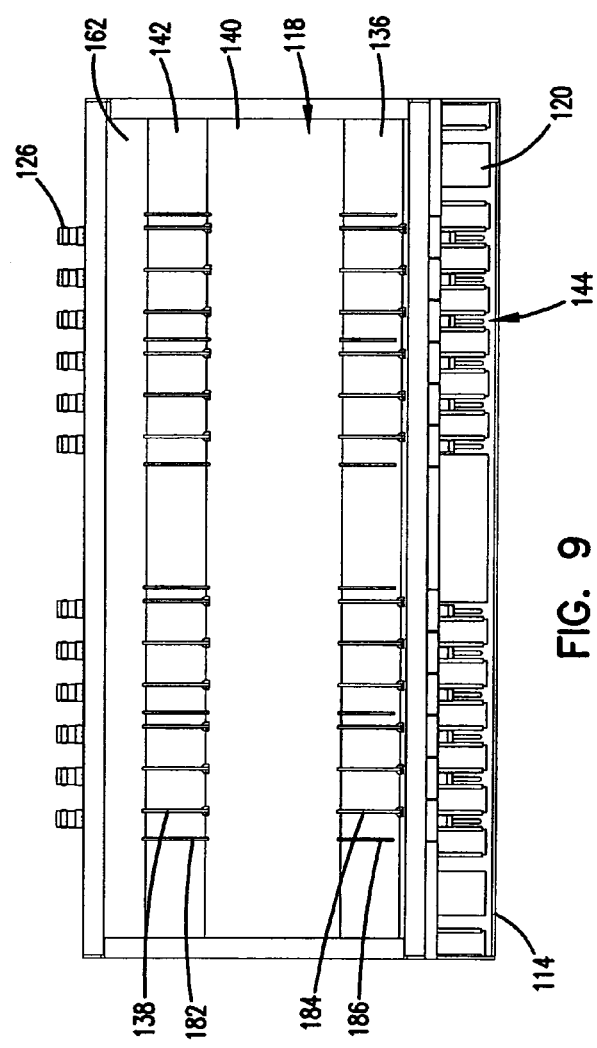
FIG. 9 is a bottom view of the empty chassis.

FIG. 9 shows a bottom view of the chassis 100. The slots 144 of the cable guide 120 are visible along with the card slots 138, 184 and divider slots 182, 186 of the bottom horizontal surface 118. Also shown are the recessed areas 140 and 162 defined by the first ridge 136 and second ridge 142. As discussed above, the divider slots 186 of the first ridge 136 do not fully extend across the first ridge 136. This enables the divider walls to fit into the divider slots 186 and be held in place so that they cannot slide out the front of the chassis 100.

Figure 11:
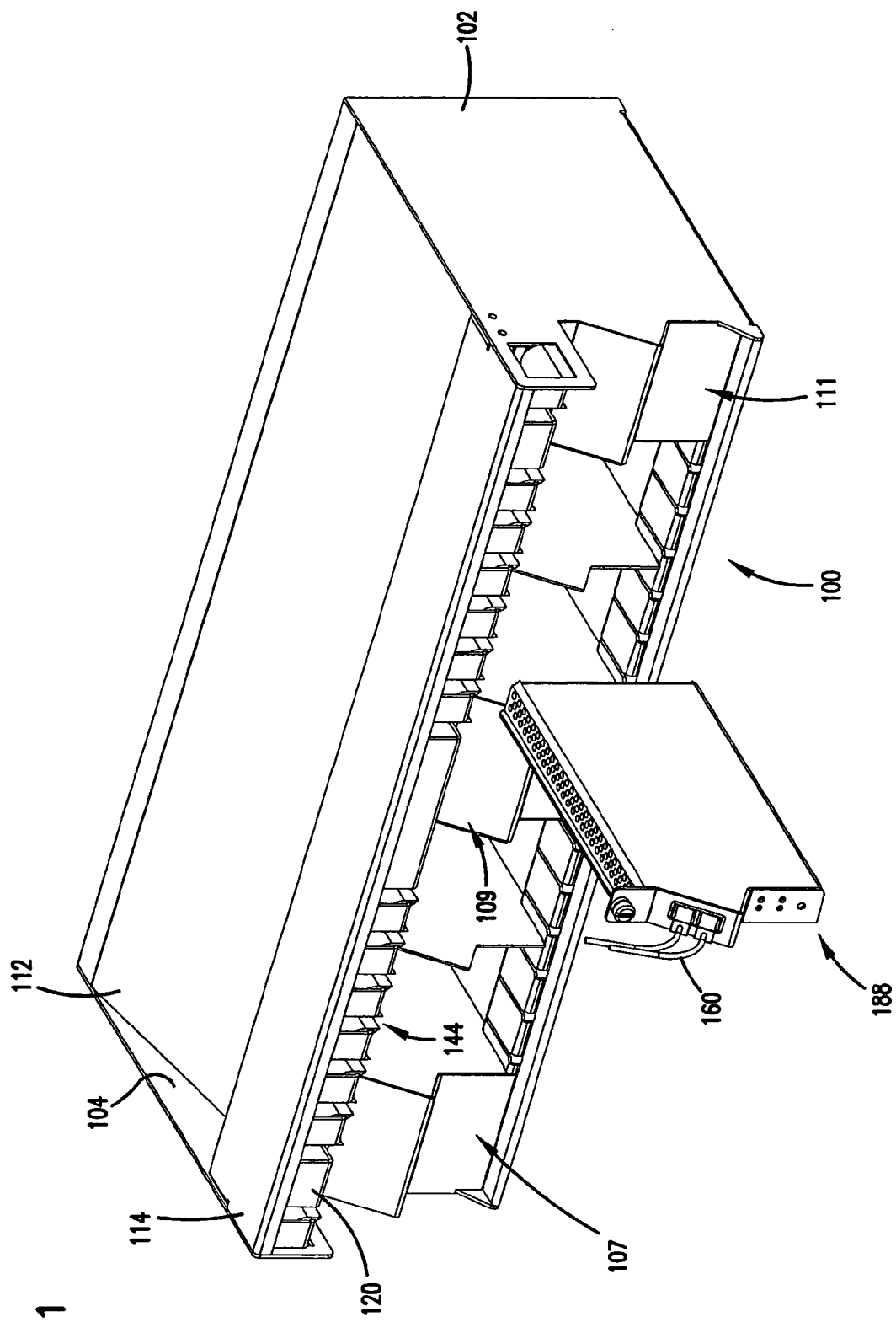
FIG. 11 is a top front view of the empty chassis with an alternative module embodiment being inserted.

FIG. 10 shows a rear view of the chassis including the backplane 124. The first baffle surface 112 and second baffle surface 122 can be seen as well as the input and output coaxial connectors 125 and 126. Typically, each module 116 inserted into the chassis 100 becomes electrically connected to one pair of the input and output connectors 125, 126. FIG. 11 shows a perspective view of the chassis 100 with an alternative module 188 being inserted. The alternative module 188 includes a shell surrounding the circuit board of the module 188 which is discussed in more detail below with reference to FIGS. 18 and 19.

Figure 12:
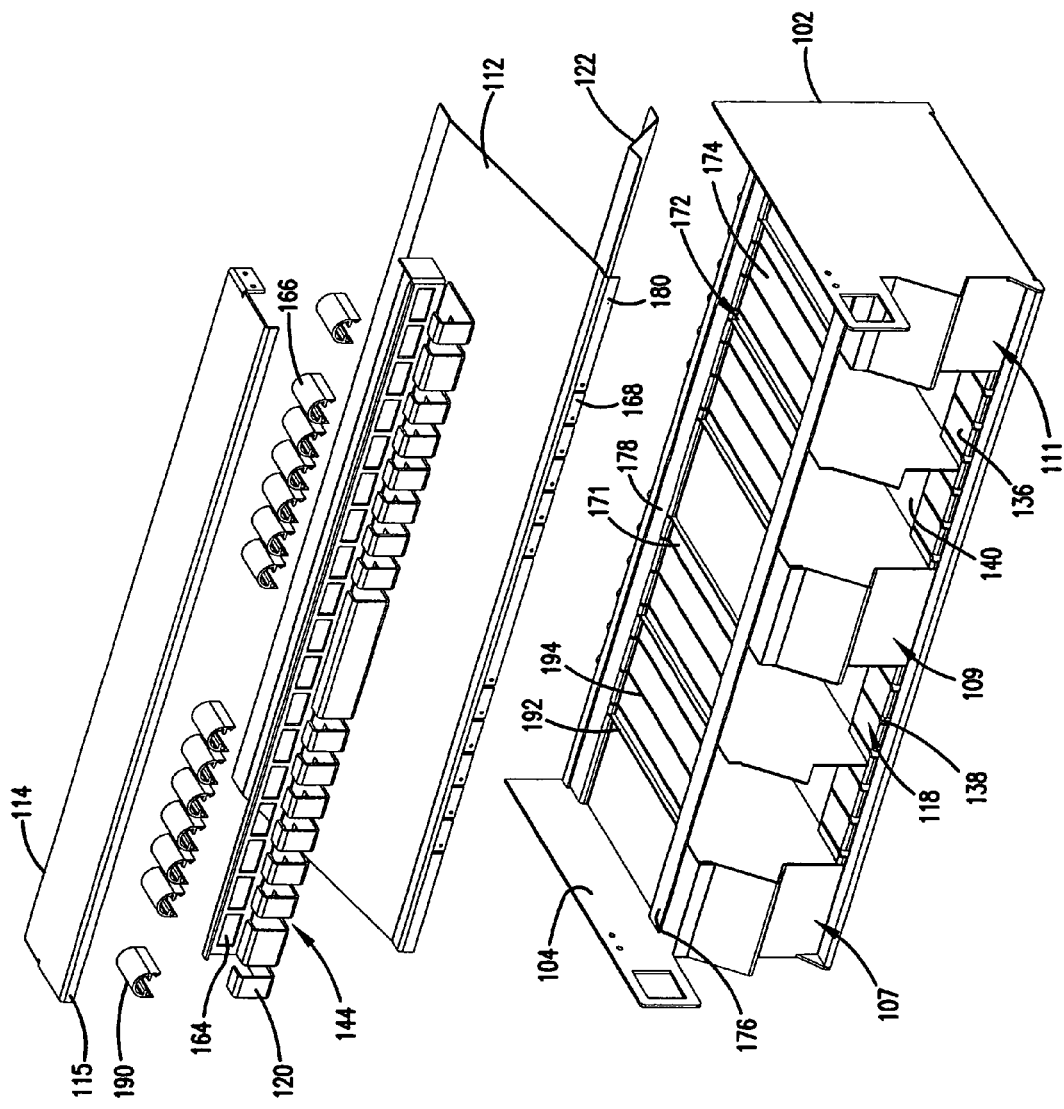
FIG. 12 is an exploded perspective view of the empty chassis.

FIG. 12 shows an exploded view of the chassis 100 where the heat baffle components and cable guide components have been exploded. The details of the top horizontal surface 172 can be seen including the first ridge 176, second ridge 178, and recessed area 174 between the first and second ridges 176, 178. The first and second ridges 176, 178 are parallel to each other and are perpendicular to the longitudinal axis of the vertical sidewalls 102, 104. Also visible are card slots 194 for receiving a top edge of the modules 116 and divider slots 192 for receiving a top edge 171 of the divider walls 128, 130, 132, 170, and 134. As with the bottom horizontal surface 118, the ridges 176, 178 allow the card slots 194 to be included while maintaining the rigidity of the top horizontal surface 172. Rather than being included in the ridges 176, 178, the card slots 194 extend across the recessed area 174 but not across the ridges 176, 178 to receive the top edge of modules 116.

The card slots 194 and divider slots 196 are perpendicular to the ridges 176, 178 and are aligned with the card slots 138, 184 and divider slots 182, 184 of the bottom horizontal surface 118. Additionally, the lip 180 of the baffle surface 112 can be seen as can the card slots 168 of the lip 180. The card slots 168 align with the card slots 194 of the top horizontal surface 172 to enable the modules 116 to be inserted into the chassis 100.

Figure 13:
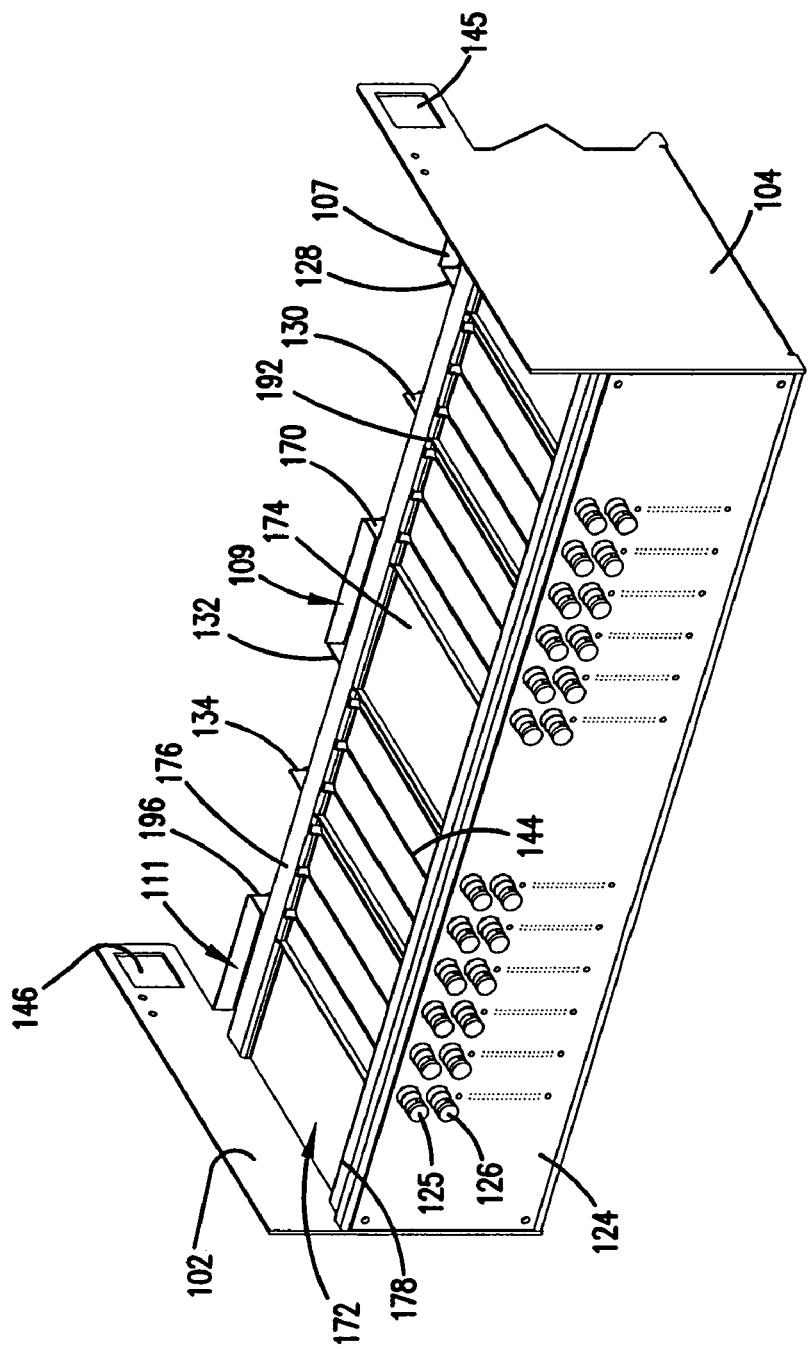
FIG. 13 is top rear perspective view of the empty chassis with a heat baffle removed.

The details of the top horizontal surface 172 can also be seen in FIG. 13 wherein the heat baffle and cable guide 120 have been removed. The divider wall 196 abutting the front cover 111 can be seen as can divider walls 128, 130, 170, 132, and 134 where walls 132 and 170 abut the front cover 109 and divider wall 128 abuts front cover 107. In the embodiment shown, four module compartments are formed by the divider walls 128, 130, 170, 132, 134, and 196 that may prevent the spread of flames should a fire be imposed.

Figure 14:
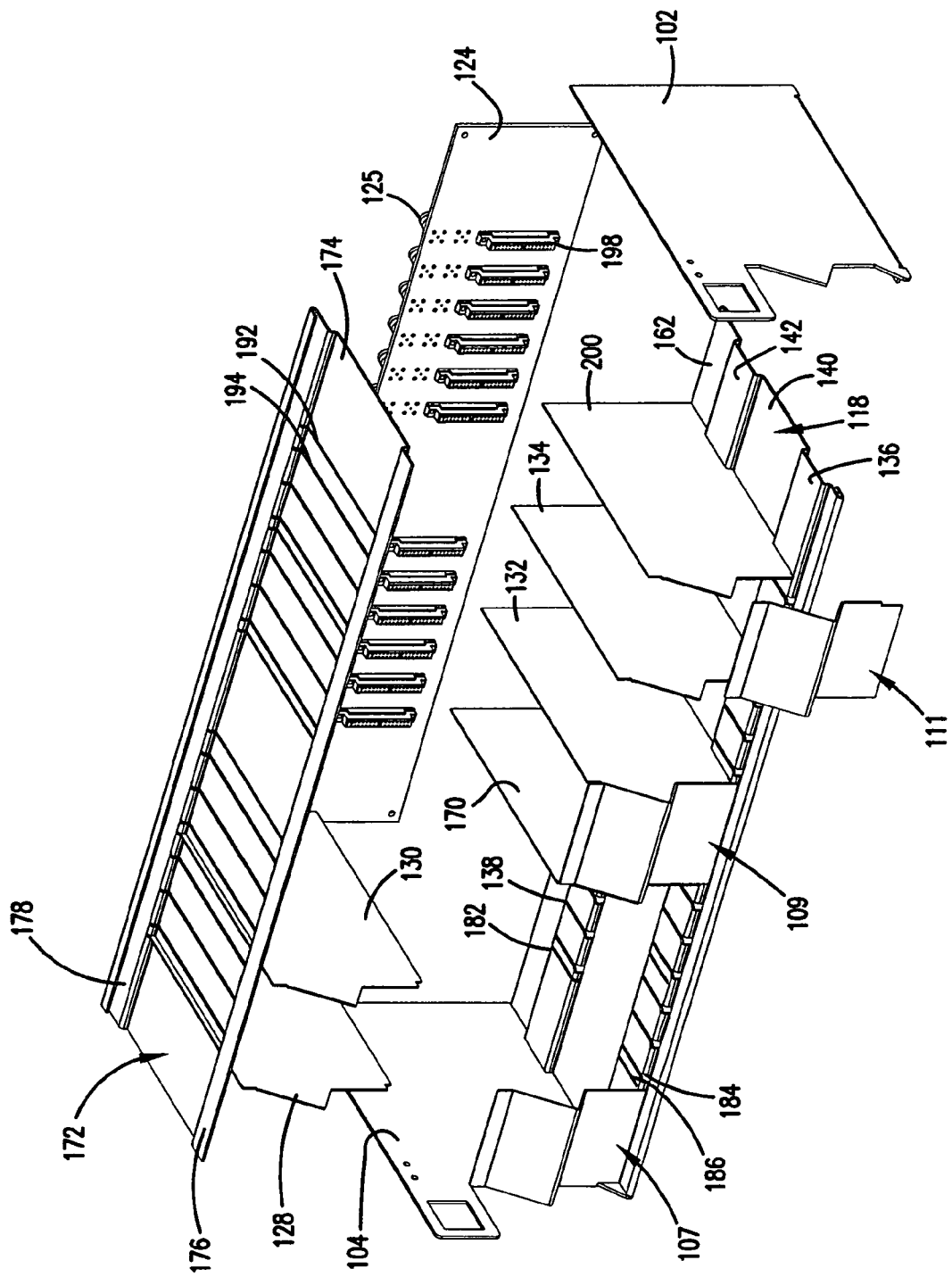
FIG. 14 is an exploded perspective view of the empty chassis with the heat baffle removed.

FIG. 14 shows an exploded view of the chassis 100 including the backplane 124 and top horizontal surface 172. The backplane 124 includes several module connectors 198 that receive a connector of the module 116 to establish electrical continuity between the input and output coaxial connectors 125, 126 and the circuitry of the module 116.

FIG. 15 shows an embodiment of a module 116. The module 116 includes circuitry 224 for transferring signals from an input to an output. As shown for this embodiment, the circuitry 224 for transferring signals is specifically for converting input electrical signals to output optical signals and/or for converting input optical signals to output electrical signals. The operation of the circuitry 224 is discussed below. The module 116 includes a printed circuit board 236 having top edge 216 and bottom edge 218 that fits within the card slots of the chassis 100 previously discussed. The module also includes a cage 222 enclosing several components of the circuitry 224 to provide isolation from electromagnetic interference. The cage 222 may be made of metal such as aluminum.

The module 116 also includes a connector 220 for engaging the backplane connector 198 previously discussed. A faceplate 202 is included with the first vertical portion 206, second portion 210 angled with respect to the first portion, and a third portion 212 that is perpendicular to the second portion 210. The faceplate 202 may be made of metal and includes a visual indication area 208 where light emitting diodes (LEDs) protrude from openings. The LEDs give an indication of the operational state of the circuitry 224. The faceplate 202 also includes a handle 204 that a user may grasp when inserting or removing the module 116 from a chassis 100. A fiber optic cable connector 214 is included and has a connection axis, which is the direction of insertion of the cables 160, that is perpendicular to the third portion 212 and parallel to the second portion 210.

FIG. 16 shows the opposite side of the module 116. The connector 220 protrudes beyond the back of the circuit board 236. The faceplate 202 includes mounting arms 232 and 234. Mounting arm 232 extends from the third portion 212 to the printed circuit board 236, and the mounting arm 234 extends from the first portion 206 to the printed circuit board 236.

FIG. 17 shows an exploded view of the module 116. The cage 222 is mounted to the circuit board 236 with mount 226. As shown, the fiber optic cable connector 214 is mounted along a front edge 237 of the printed circuit board 236 but is angled with respect to the front edge 237. The fiber optic cable connector 214 includes an input connector 213 and an output connector 215. The fiber optic cable connector 214 protrudes through an aperture 230 in the third portion 212 of the faceplate 202.

FIGS. 18 and 19 show an alternative module 188. This module 188 has a shell 236 covering the entire printed circuit board 258. The shell 236 may be made of a metal such as aluminum. The circuit board 258 includes a connector 260 that protrudes from the back of the shell 236 that can be inserted into a module connector 198 of a chassis 100. The shell 236 includes a top surface 250 with ventilation holes 252. The shell 236 also includes a bottom surface 254 with ventilation holes 256. The circuit board 258 may mount to a side surface 266 of the shell 236. The side surface 266 includes top edge 248 and bottom edge 274. These edges 248, 274 may be positioned within card slots of the chassis 100 when the module 188 is inserted.

The printed circuit board 258 includes a front edge 259 and a fiber optic cable connector 246 is mounted along the first edge 259. The fiber optic cable connector 246 is mounted such that the connection axis is angled with respect to the front edge 259 so that at least a portion of the fiber optic cable connector 246 extends beyond the front edge 259. The fiber optic cable connector 246 includes an input connector 245 and an output connector 247. As with the previous module 116, module 188 may contain circuitry 264 for transferring signals. The circuitry 264 may convert electrical signals to optical signals and optical signals to electrical signals as discussed in detail below.

The side surface 266 has three portions 268, 270, and 272 to its front edge. The first portion 272 is substantially vertical when installed in a chassis 100. The second portion 270 is angled with respect to the first portion 272. The third portion 268 is substantially perpendicular to the second portion 270 and is angled with respect to the first portion 272. Similarly, the shell 236 includes a first portion 273 that is also substantially vertical when mounted in the chassis 100 as well as a second portion 271 that is angled with respect to the first portion 273. A third portion 269 is substantially perpendicular to the second portion 271 and angled with respect to the first portion 273.

A faceplate 238 has a first portion 240 that is substantially vertical when installed in the chassis 240 and is parallel to the first edge 259. A second portion 242 is angled with respect to the first portion and is parallel to the connection axis, and a third portion 244 is substantially perpendicular to the second portion 242 and the connection axis and is angled with respect to the first portion 240. The first portion 240 of the faceplate 238 abuts the first portion 272 of the side surface 266 and the first portion 273 of the shell 236. The second portion 242 of the faceplate 238 abuts the second portion 270 of the side surface 266 and the second portion 272 of the shell 236. Likewise, the third portion 244 of the faceplate 238 abuts the third portion 268 of the side surface 266 and the third portion 269 of the shell 236. The module 188 is shielded from electromagnetic noise by the enclosure formed by the intersection of the faceplate 238, side surface 266, and shell 236.

The faceplate 238 includes an aperture 262 in the third portion that exposes the fiber optic cable connector 246 to allow it to receive fiber optic cables 160. The faceplate 238 also has a visual indication area 176 in the first portion 240 where LEDs protrude and provide an indication of the operating state of circuitry 264. The shell 236 may also contain a back surface (not shown) opposite the faceplate 238 that has an aperture for allowing the connector 260 to extend beyond the back surface.

Figure 20:
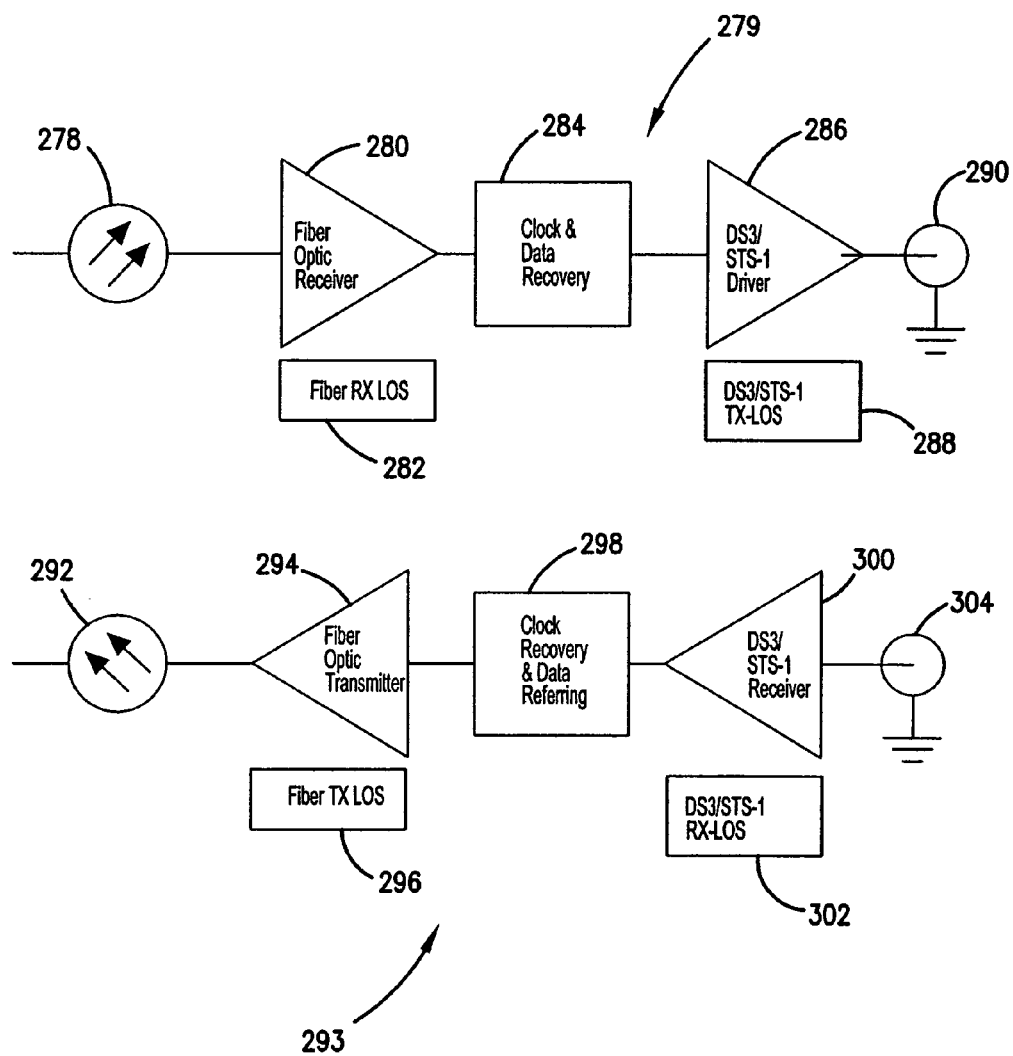
FIG. 20 is a high-level block diagram of exemplary media conversion circuitry included in either module embodiment.

FIG. 20 shows a high-level block diagram of circuitry such as that contained in module 116 of FIG. 15 or module 188 of FIG. 18 for converting electrical signals to optical and optical signals to electrical. The optical signals are received by the optical to electrical circuitry 279 through fiber media 278. A fiber optic receiver 280 receives the optical signal and passes it to clock and data recovery circuitry 284. A optical receiver loss-of-signal (LOS) circuit 282 detects the signal level received by the fiber optic receiver 280 to determine whether a signal is present. If not, a minor alarm is generated whereby a visual indicator on the faceplate is triggered and an alarm signal is delivered through the backplane of the chassis to a downstream device.

Clock and data recovery circuit 284 of a given data rate, such as Digital Signal Heirarchy 3 (DS3) (44.736 Mbps) or SONET Synchronous Signal Transfer rate (STS-1) (51.840 Mbps), extracts the clock and data information from a data stream provided by the optical receiver 280. An electrical signal driver 286 of the particular data rate receives the clock and data and reconstructs the electrical signal with the appropriate amplitude and shape before outputting it through an electrical conductor 290. An electrical transmitter LOS circuit 288 detects the signal level output by the driver 286 to determine whether the driver 286 is functioning. If not, a major alarm is generated whereby a visual indicator on the faceplate is triggered and an alarm signal is delivered through the backplane of the chassis to the downstream device.

The electrical signals are received through electrical conductor 304 by the electrical to optical circuitry 293. A receiver circuit 300 of a given data rate recovers the clock and re-times the data prior to sending the signal to the differential driver circuit 298. An electrical receiver LOS circuit 302 detects the signal level received by the receiver circuit 300 to determine whether a signal is present. If not, a minor alarm is generated whereby a visual indicator on the faceplate is triggered and an alarm signal is delivered through the backplane of the chassis to a downstream device.

A differential driver circuit 298 operating at a given data rate then converts the data to a differential signal. A fiber optic transmitter 294 then takes the differential signal and converts it to light pulses delivered to the optical media 292. Optical transmit LOS circuit 296 detects the signal level output by the optic transmitter 294 to determine whether the optic transmitter is functioning. If not, a major alarm is generated whereby a visual indicator on the faceplate is triggered and an alarm signal is delivered through the backplane of the chassis to a downstream device.

Figure 21:
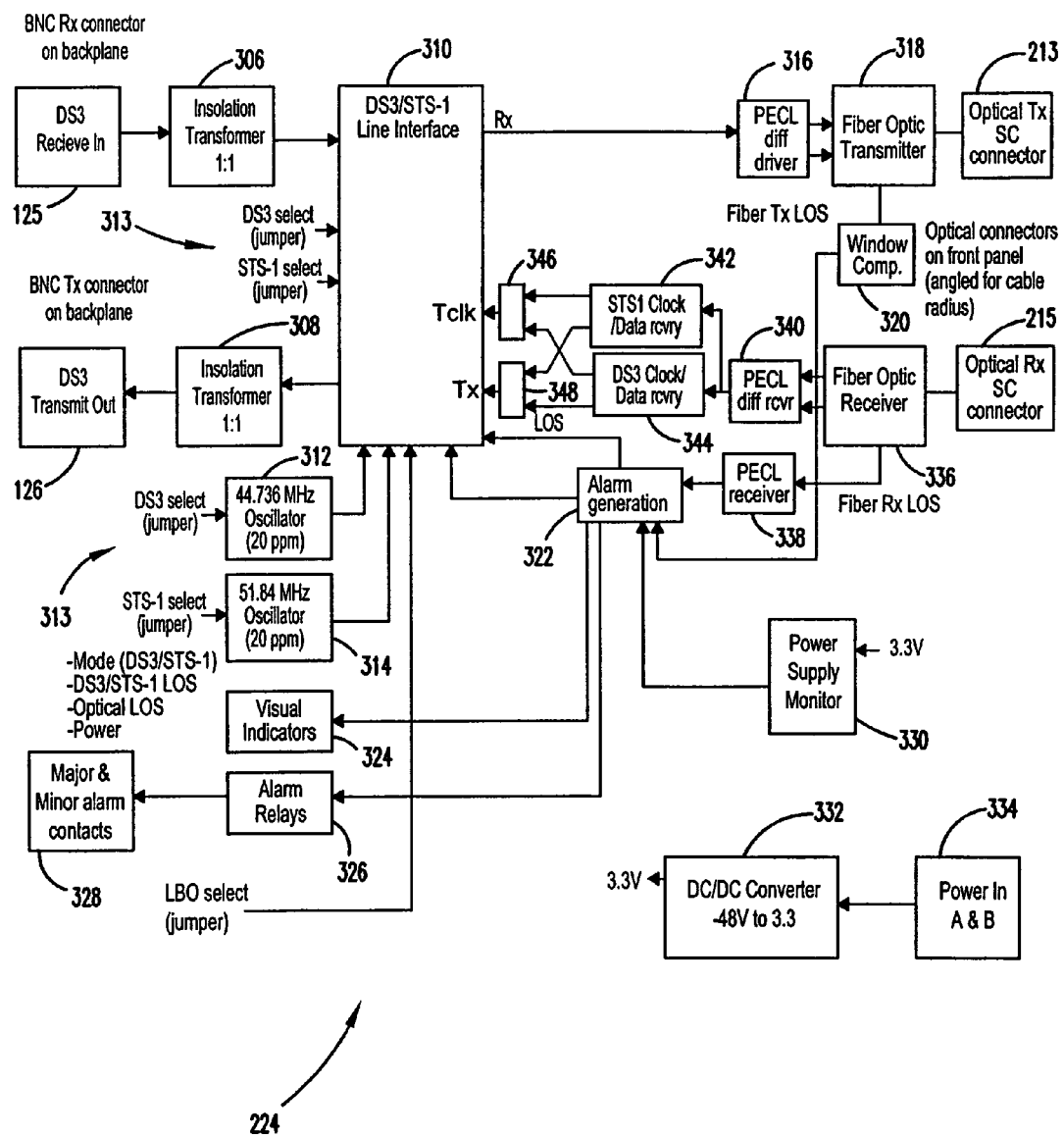
FIG. 21 is a detailed block diagram of exemplary media conversion circuitry.

FIG. 21 shows a detailed block diagram of the circuitry 224 for converting optical signals to electrical and electrical signals to optical. The circuitry 224 of the block diagram of FIG. 21 is configured to convert optical signals to electrical signals of two different data rates and to convert electrical signals of two different data rates to optical signals. As described below, a user may selectively configure the circuitry 224 for one data rate or the other by positioning a switch to a first position to enable certain components dedicated to one data rate to function or positioning the switch to a second position to enable other components dedicated to another data rate to function.

The circuitry 224 receives an electrical signal of one of the data rates through the coaxial connector 125 of the chassis 100 previously discussed. The electrical signal passes through an input isolation transformer 306 and then to a line interface unit 310 (LIU), such as the Exar XRT73L00IV or the Infineon PEB 3452-V12. The LIU 310 is set to operate at the desired data rate and reconstructs the data signal by recovering the clock and retiming the data. The LIU 310 typically includes an automatic gain control that changes the gain and equalization to compensate for cable losses.

The LIU 310 is set to operate at the appropriate data rate by a data rate jumper or switch 313 that is manipulated by the user. Additionally, a reference signal generator, such as the DS3 oscillator 312 and/or STS-1 oscillator 314 feeds a reference clock signal to the LIU 310. The particular oscillator output 312 or 314 received by the LIU 310 is also controlled by user manipulation of the data rate jumper 313. An exemplary oscillator is the Mtron M8S28TCJ.

A Pseudo Emitter Coupled Logic (PECL) differential driver 316 receives a single rail non-return-to-zero (NRZ) data stream with a Low Voltage Transistor-Transistor Logic (LVTTL) level from the LIU 310 and converts this signal to a differential Low Voltage Pseudo Emitter Coupled Logic (LVPECL) signal. A fiber optic transmitter 318 then outputs light pulses based on the differential LVPECL signal to the output optical connector 213 of the module 116 previously discussed.

A window comparator 320 is driven by an analog monitor signal provided by the fiber optic transmitter 318 to determine whether a signal is present. If not, then the window comparator 320 outputs a trigger signal to alarm circuitry 322. Alarm circuitry 322 then drives an LED from the set of visual indicators 324 exposed on the visual indicator area 208 of module 116. Alarm circuitry 322 also triggers an alarm relay 326 to send an alarm signal through contacts 238 of the backplane 124. Alarm circuitry 322 is generally a portion of a programmable logic device (PLD) such as the Atmel ATF1504ASV-15AI44.

Optical signals are received through optical connector 215 of the module 116. A fiber optic receiver 336 receives the light pulses and generates an LVPECL differential signal. A PECL differential receiver 340 takes the differential signal and generates an intermediate signal that is a single-ended LVTTL NRZ data stream. This intermediate signal is delivered to a clock and data recovery circuit 342 or 344 of the selected data rate as chosen by the position of jumper or switch 313. As shown, the two data rates are DS3 for data recovery circuit 344 and STS-1 for data recovery circuit 342. One skilled in the art will recognize that other data rates are possible as well. A PECL receiver 338 detects whether the difference signal is present from the fiber optic receiver 336 and sends a signal to the alarm circuit 322 if the signal is absent. The alarm circuit 322 then triggers the visual indicator 324 and an alarm relay 326 which then sends a signal through alarm contacts 238 of the backplane 124.

The outputs of the data and clock recovery circuits are logically OR'd together through signal switching device 346 for the clock and signal switching device 348 for the data. The jumper or switch 313 controls the switching devices 346, 348 so that the appropriate clock and data recovery circuit 342 or 344 is in communication with the LIU 310. The switching device 346 feeds the clock signal to the transmit clock input of the LIU 310. The switching device 348 feeds the data signal to the transmit data input of the LIU 310.

The LIU 310 reconstructs the data signal and amplifies and shapes the output data signal based on the cable to be used to transfer the electrical signal. The output electrical data signal is passed through isolation transformer 308 and then to the output coaxial connector 126 of the chassis 100.

The circuitry 224 is powered by a −48 V DC power connection 334 in the backplane 124 of the chassis 100. The −48V DC power is supplied through the connectors 198 of the backplane 124 to the connectors 220 of the module 116. The module 116 may include a DC-DC converter 332, such as the Ericsson PKF4610, that creates a 3.3 V output that is distributed to the various active components of the circuitry 224. A power supply monitor 330 may be included to detect whether the DC-DC converter 332 is providing the appropriate voltage and may send a signal to trigger the alarm circuit 322 if the voltage is not correct. The alarm circuitry 322 may then trigger a relay 326 to activate a visual indicator 324 and a major alarm signal through a backplane contact 238.

The fiber optic transmitter 318 and receiver 336 may be combined along with the window comparator 320 and PECL receiver 338 into one unit such as the OCP DTR-052-3.3-SM2-A-L3 or Excelight SCM7591XC-W optical transceiver that also includes the PECL differential driver 316 and PECL differential receiver 340. The clock and data recovery circuits 342, 344 may be the Vectron TRUOIO-GKLGB or Micrel SY87700LHI.

Figure 22:
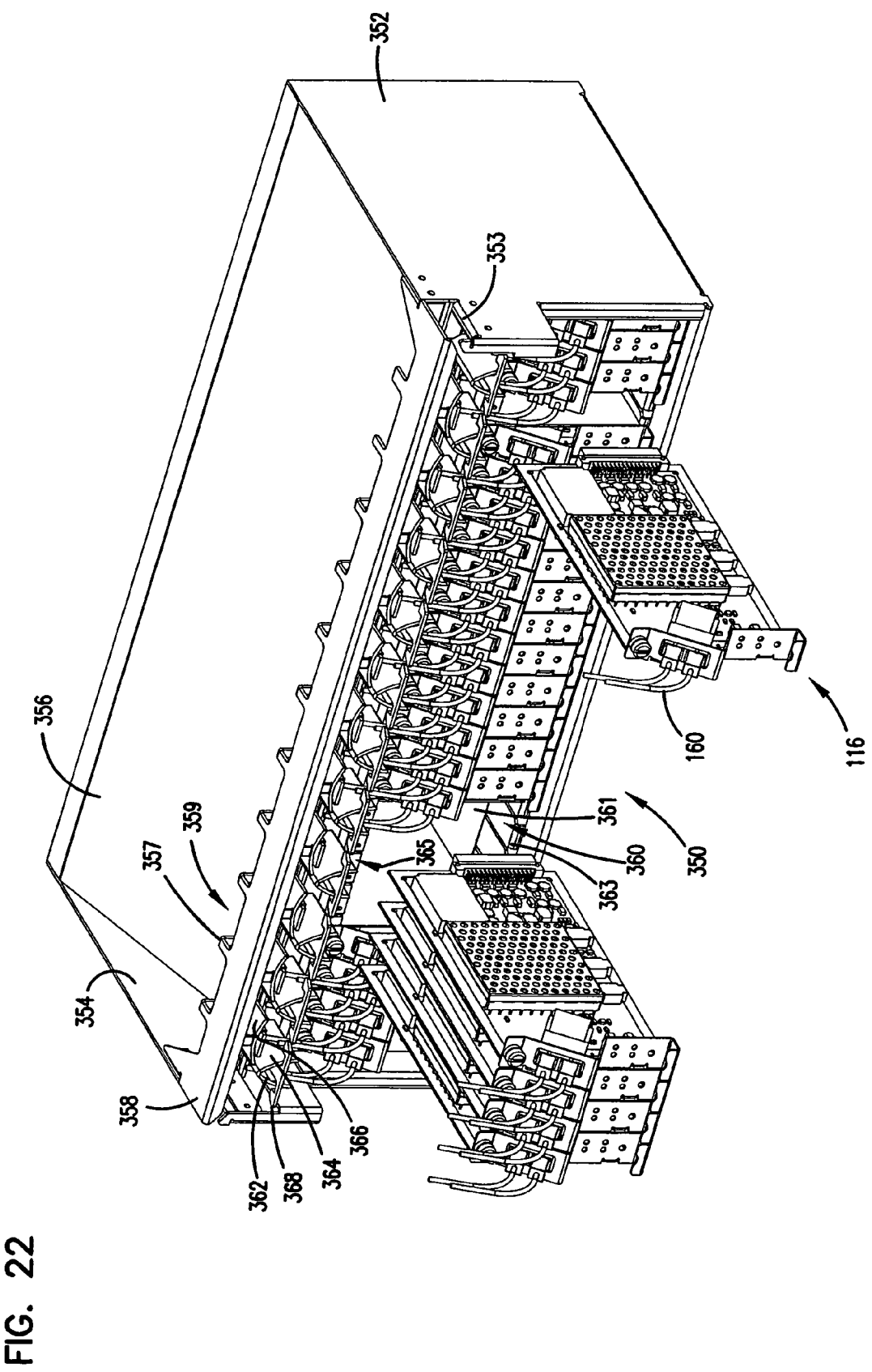
FIG. 22 is a top front perspective view of a chassis according to a first alternative embodiment of the present invention.

FIG. 22 shows a first alternative embodiment of a loaded chassis 350 made of materials such as those discussed with reference to the chassis 100 of FIG. 1. This chassis 350 is configured to utilize all of its width to accommodate modules 116. As shown, the embodiment of FIG. 22 holds twice as many modules 116 as the chassis 100 of FIG. 1. The chassis 350 includes a right vertical sidewall 352 and a left vertical sidewall 354. A heat baffle surface 356 is also included between the vertical sidewalls 352, 354.

A cable guide 368 is also included between the vertical sidewalls 352, 354. The cable guide 368 includes several alternative radius limiters 362 for preventing overbending of fiber cables 160. The radius limiter 362 includes a vertically oriented arch 364 adjacent to each cable slot 365 and a horizontally oriented arch 366 placed above and between each vertically oriented arch 364. The cables may then pass beside the vertically oriented arch 364 and above the horizontally oriented arch 366 until exiting out an exit opening 353 formed by the sidewall 352 or 354 and a cable guide cover 358.

The cable guide cover 358 may contain rear downward extensions 357 defining a plurality of open areas 359. The open areas 359 allow air to penetrate through the cable guide 368 and enter the area above the heat baffle surface 356. As before, this enables the area above the heat baffle surface 356, such as another chassis mounted in a rack, to be ventilated.

The bottom horizontal surface 361 of this embodiment includes at least one ridge 360. The ridge 360 may include card slots 363 for receiving edges of the modules 116. The chassis 350 may also include a top horizontal surface (not shown) like that of the previously discussed embodiment shown in FIG. 12. The top horizontal surface may also contain card slots for receiving a top edge of modules 116. Both the top horizontal surface and the bottom horizontal surface 361 may contain ventilation holes between card slots, as shown below with reference to additional embodiments, or may be made of a mesh material with densely spaced holes.

FIGS. 23 and 24 are perspective front views of a loaded chassis 400 of a second alternative embodiment. This embodiment of the chassis 400 contains spacing like that of the embodiment of FIG. 1 so that the total width of the chassis 400 is significantly greater than the cumulative widths of the modules 422 that it contains thereby allowing the chassis 400 to fit within a given rack size. The chassis 400 includes right and left vertical sidewalls 402, 404 that may be made of a metal such as cold-rolled steel with a chromate plating. The vertical sidewalls 402, 404 have portions 412, 416 that form front panels of the chassis 400. Another front panel 414 of the same material is also included and has three distinct portions. A first substantially vertical portion 418 forms the bottom. A second portion 420 is angled with respect to the first portion 418. A third portion 444 is substantially vertical and lies in a different plane than the first portion 418.

The front panel 414 is flush with a faceplate 424 of modules 422 mounted within the chassis 400. The faceplate 424 has three portions including a first substantially vertical portion 426 that is aligned and flush with the first portion 418 of the front panel 414. The faceplate 424 also has a second portion 428 that is angled with respect to the first portion 418 and aligned and flush with the second portion 420 of the front panel 414. The faceplate 424 additionally has a third portion 430 that is substantially vertical but lies within a different plane from the first portion 426 and that is aligned and flush with the third portion 444 of the front panel 414. The faceplate 424 and front panel 414 together create a seamless front surface to the chassis 400 thereby protecting the interior region and circuitry housed by modules 422.

The chassis 400 also includes a baffle surface 436 disposed between the vertical sidewalls 402, 404 that is a solid metal such as cold-rolled steel or aluminum. A cable guide 406 is also included and mounts to the vertical sidewalls 402, 404. The cable guide 406 includes several cable slots 434 and radius limiters 410 adjacent to each cable slot. A cable guide cover 408 is mounted atop the cable guide 406. The cable guide cover 408 has vertical extensions 440 aligned with each cable slot 434. The cable guide 406 includes vertical extensions 472 that coincide with each radius limiter 410 and are spaced between each vertical extension 440 of the cover 408. The vertical extensions 472 and 440 maintain fiber cables within the cable guide 406 while the allowing air to penetrate the cable guide 406. The second portion 428 of each faceplate 424 has a fiber optic cable connector 432 angled toward the cable guide 406 to reduce the bending of fiber cables passing from the module 422 to the cable guide 406.

A separation 442 exists between the cable guide 406 and the third portion 430 of the modules and third portion 444 of the front panel 414. This separation 442 allows air to pass into the area above the heat baffle surface 436 to ventilate the area above the heat baffle surface 436. The separation 442 of this embodiment is expanded to provide further ventilation due to the setback of the second and third portions 428, 430 of the modules 422 and second and third portions 420, 444 of the front panel 414.

The bottom-most horizontal surface 438 of the chassis 400 may be made of a metal mesh material such as aluminum with densely spaced holes throughout. As discussed below, the surface 438 underlays an additional horizontal bottom surface with structures for supporting the modules 422 and for providing ventilation to the interior of the chassis 400.

Figures 25, 26:
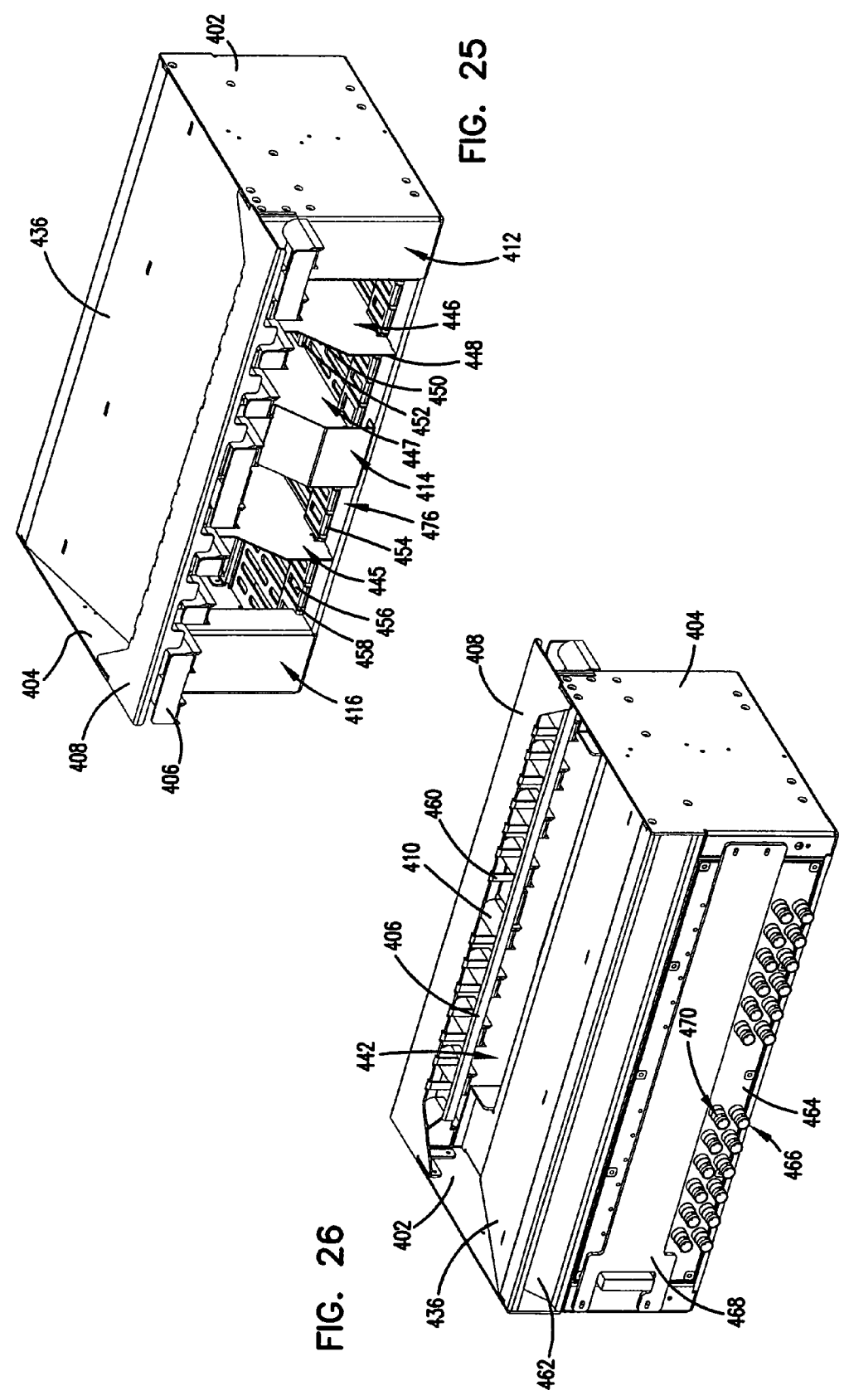

FIGS. 25 and 26 are front and rear perspective views of an empty chassis 400 of the second alternative embodiment. A horizontal bottom surface 476 can be seen and may be made of a metal such as cold-rolled steel with a chromate plating. The horizontal surface 476 has a first ridge 454 that includes card slots 458 and ventilation holes 456 between each adjacent pair of card slots 458. The chassis 400 is compartmentalized by installation of divider walls 445, 446, and 447. Each divider wall 445, 446, and 447 has a front edge with three distinct portions including a bottom substantially vertical first portion 448, a second portion 450 angled with respect to the first portion 448, and a substantially vertical third portion 452 set-back from the first portion 448. The divider walls 445, 446, and 447 fit within divider slots in the first ridge 456 which are discussed in more detail below.

The cable guide cover 408 includes vertical extensions 460 on the rear side of the cover 408. These extensions 460 permit air to flow through the rear of the cover 408 while preventing fiber cables from escaping. The heat baffle includes heat baffle surface 462 which extends from the first baffle surface 436 toward a backplane 464. The heat baffle surface 462 is typically a metal mesh material that diffuses flames but allows hot air to pass through. The first heat baffle surface 436 is generally solid metal to prevent hot air and flames from rising into areas above the chassis 400.

The backplane 464 of the chassis 400 is typically a printed circuit board that establishes electrical connection between the input and output coaxial connectors 466 and 470 and a backplane connector discussed below that interfaces with a connector on the modules 422. Conductive pins and/or circuit traces may be exposed on the backplane 464 so a lexan cover 468 is placed over the vulnerable areas of the backplane 464.

FIG. 27 shows a top view of the second alternative chassis 400. The orientation of the cable guide cover 408, first heat baffle surface 436, modules 422, and front panel 414 can be seen. The opening 442 over the modules 422 and front panel 414 allows air to be circulated beyond the cable guide 406 and cover 408 and the first heat baffle surface 436 directs it into the area above the chassis 400. FIG. 28 shows a front cross-sectional view taken through line A-A of FIG. 27. The cable guides 410 are visible along with the modules 422 and front panel 414. The rear portion of the cable guide 406 can be seen in relation to the rear vertical extensions 460 that allow air to pass through the rear of the cable guide 406 to the first baffle surface 436.

FIG. 29 is a front view of the chassis 400 which shows the alignment of the modules 422 relative to the cable slots 434 and vertical extensions 470 and 440. The cable slots 434 are positioned such that two modules 422 lie beneath each cable slot 434 allowing fiber cables to pass directly from the modules 422 to the cable guide 406 through the cables slots 434. FIG. 30 is a side view taken through line B-B of FIG. 29. The orientation of the fiber optic cable connector 432 relative to the cable guide 406 can be seen. The angled second portion 420 of the front panel 414 is flush with the second portion 428, and the connection axis of the fiber optic cable connector 432 is directed at the cable guide 406 to minimize the bending of the fiber cables.

The heat baffle surfaces are also visible in FIG. 30. The first heat baffle surface 436 is angled with respect to the horizontal surfaces of the chassis 400 and is perpendicular to the plane of the vertical sidewalls 402, 404. The second heat baffle surface 462 is angled with respect to the horizontal surfaces, also angled with respect to the first heat baffle surface 436, and is perpendicular to the plane of the vertical sidewalls 402, 404. This embodiment also includes a third heat baffle surface 474 that lies within a plane parallel to the second heat baffle surface 462, with a separation 461 existing between the second 462 and third 474 heat baffle surfaces. Both the second 462 and third 474 heat baffle surfaces may be made of a mesh metal material such as aluminum with densely spaced holes which act as a flame diffuser while allowing hot air to escape. The separation 461 further enhances the diffusive character of the heat baffle surfaces 462, 474.

Figure 31:
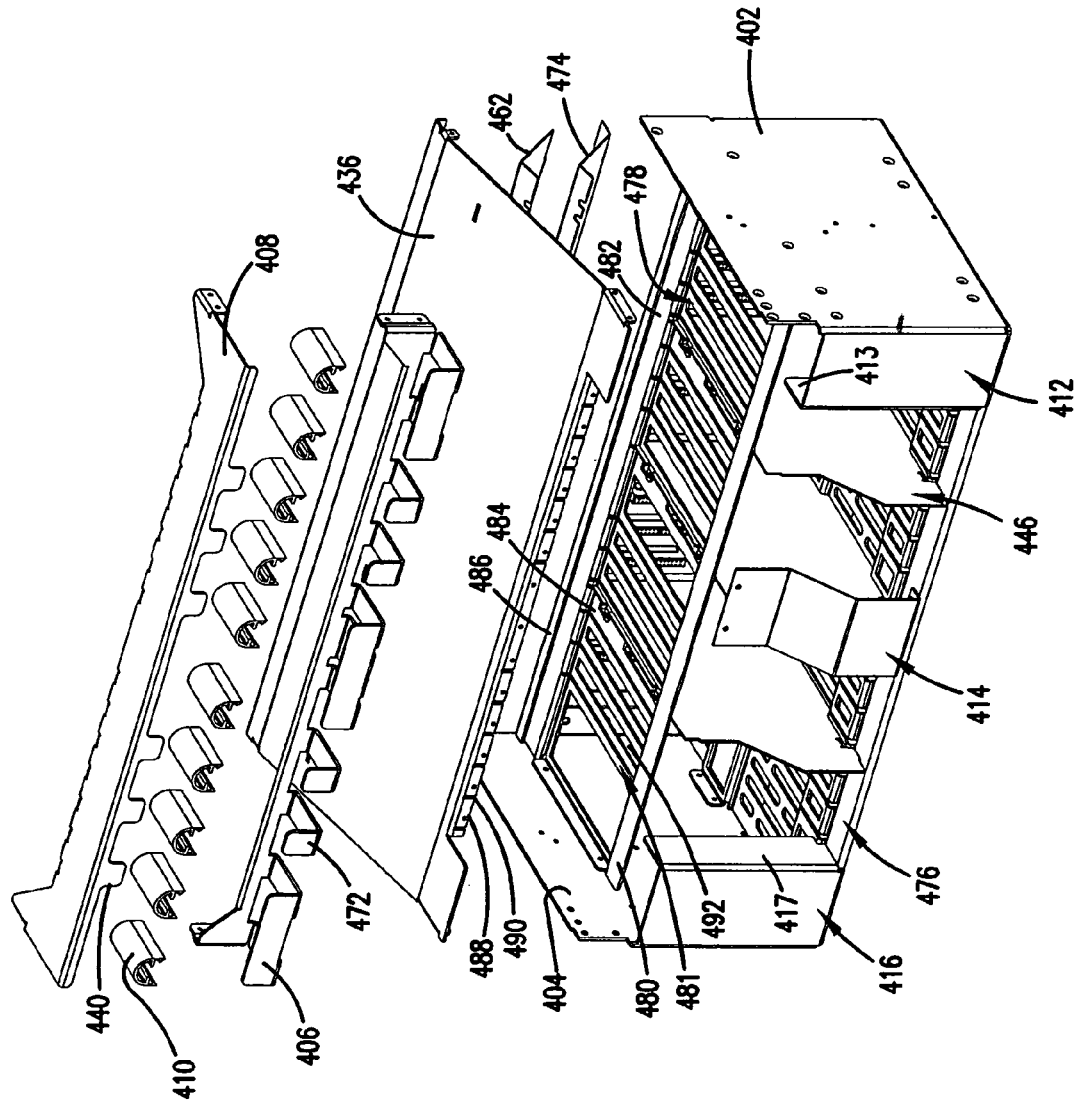
FIG. 31 is an exploded perspective view of the empty chassis of FIG. 25.

FIG. 31 is an exploded perspective view of the chassis 400. A top horizontal surface 478 can be seen which underlies the heat baffle surfaces 436, 462, and 474. The top horizontal surface 478 includes a first ridge 480 and a second ridge 482 and may be made of metal such as cold-rolled steel with a chromate plating. A recessed area 481 lies between the ridges 480, 482 and has card slots 486 and divider wall slots 484. The card slots 486 receive top edges of modules 422, and the divider slots 484 receive top edges of divider walls 446. Ventilation holes 492 are provided between each adjacent pair of card slots 484. The ventilation holes 492 allow hot air to rise out of the interior region of the chassis 400 and escape through the exit of the heat baffle formed by surfaces 462 and 474.

Also visible in this view is a lip 488 of the heat baffle surface 436. The lip 488 hangs below and in front of the top horizontal surface 478 and receives the faceplate 424 of the modules 422. The lip 488 has card slots 490 that align with the card slots 484 of the top horizontal surface 478 to allow the top edge of the modules 422 to slide into the interior region of the chassis. The ridges 480 and 482 of the top horizontal surface 478 allow the card slots 486 and divider slots 484 to extend fully across the recessed area 491 while maintaining rigidity of the surface 478.

The vertical sidewalls 402, 404 have, in addition to the front panel portions 412 and 416, interior side extensions 417 and 413 formed by further bending of the metal making up the sidewalls 402, 404. The interior side extensions 417 and 413 abut all three portions 426, 428, and 430 of the faceplate 424 of the modules 422 that are mounted on each end so as to create a seamless barrier at the front of the chassis 400.

Figure 32:
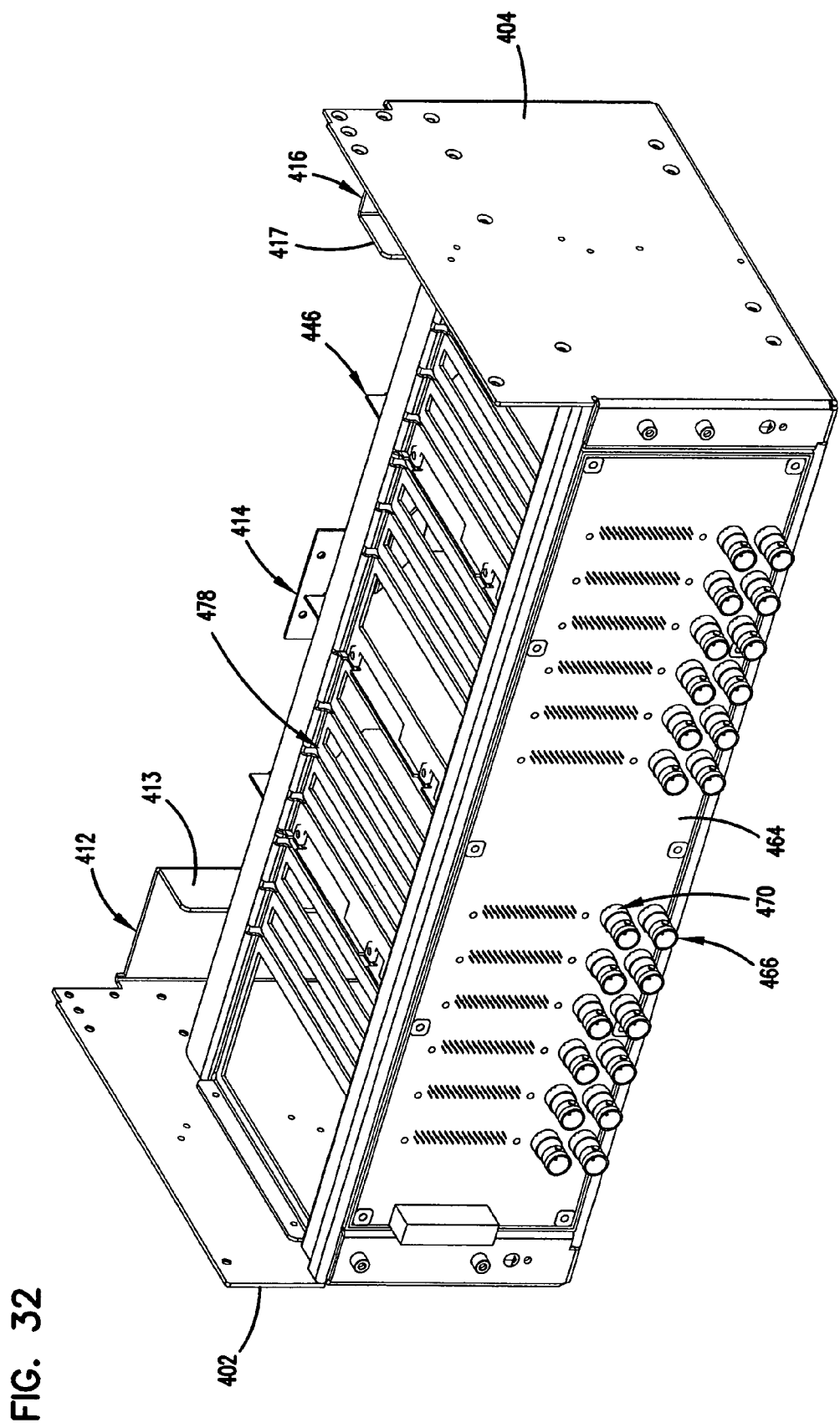
FIG. 32 is top rear perspective view of the empty chassis of FIG. 25 with a heat baffle and cable management guide removed.
Figure 33:
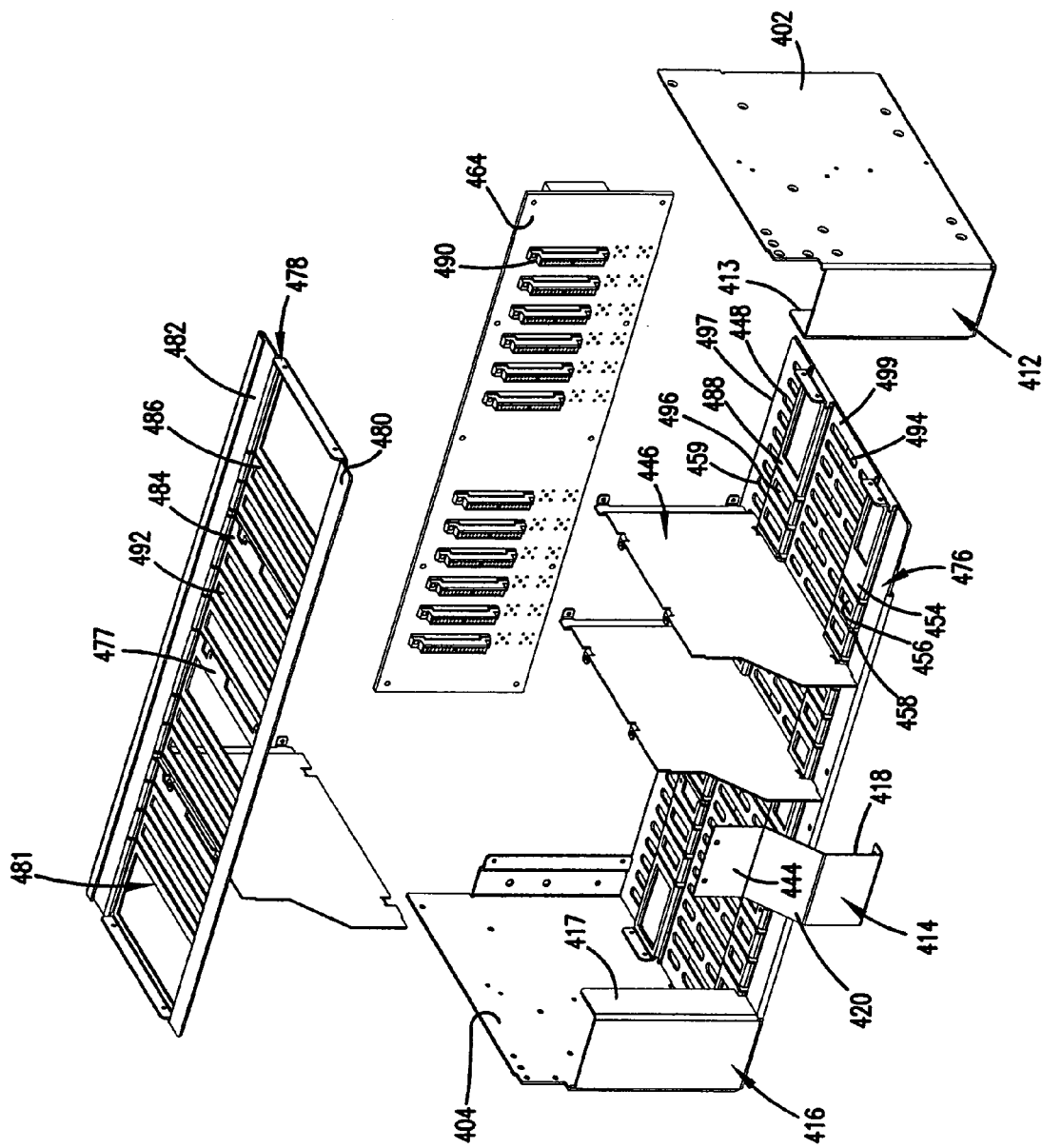
FIG. 33 is an exploded perspective view of the empty chassis of FIG. 25 with the heat baffle and cable management guide removed.

FIG. 32 shows a rear perspective view of the chassis 400 with the heat baffle surfaces and cable guide surfaces removed. FIG. 33 is an exploded view of the chassis 400 without the heat baffle surfaces and cable guide surfaces. The details of the inner side of the backplane 464 are visible, including backplane connectors 490 that engage connectors of the modules 422 when they are fully installed in the chassis 400. The details of the bottom horizontal surface 476 are also visible, including the first ridge 454, a second ridge 488, and a recessed area 499 defined by the first and second ridges 454, 488. The first ridge has card slots 458 and divider slots not seen in this view. Ventilation holes 456 are provided between each adjacent card slot 458 within the first ridge 454.

Ventilation holes 494 are provided within the recessed area 499. Ventilation holes 496 are also provided between adjacent card slots 459 of the second ridge 488. The second ridge 488 and the back edge of horizontal surface 476 define a recessed area 497 that includes ventilation holes 498.

Figure 34:
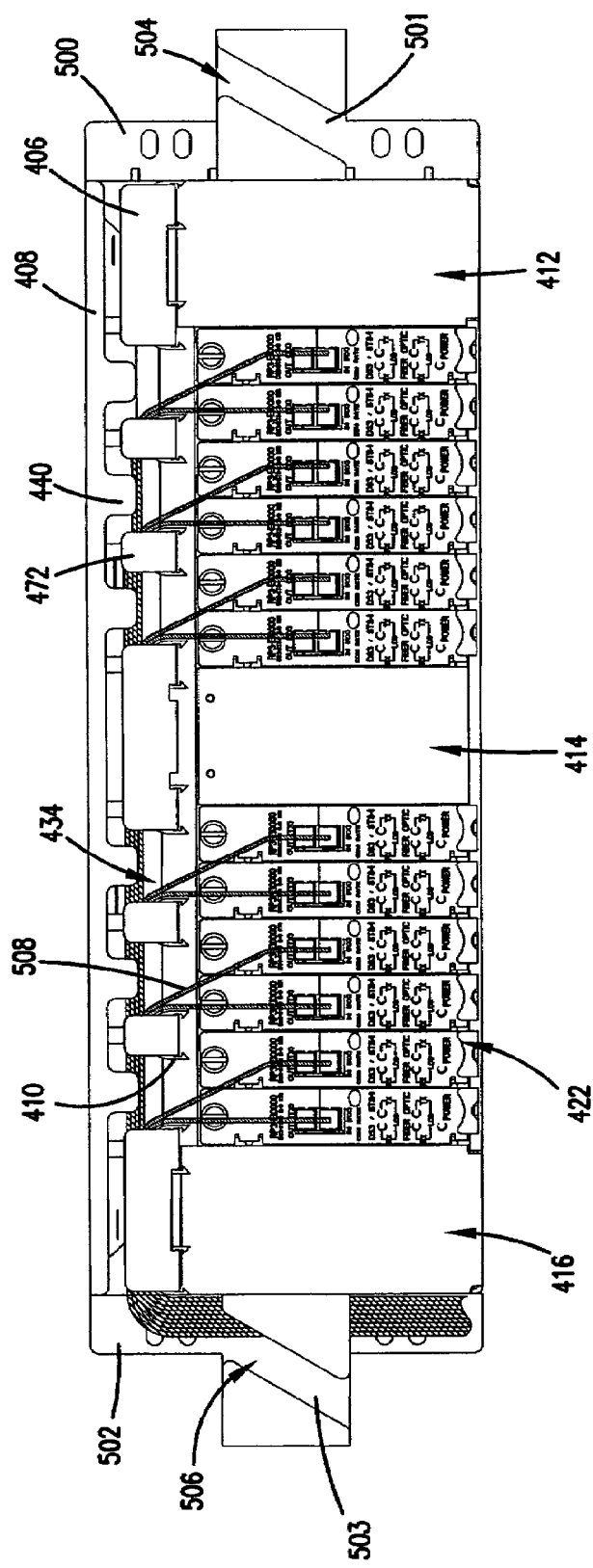
FIG. 34 is a front view of the loaded chassis of FIG. 23 with fiber optic cables connected to the modules and passing through a cable guide.

FIG. 34 shows a front view of the chassis 400 with bracket structures 504, 506 that also serve as vertical cable guides. The bracket structures 504, 506 include a bracket portion 500, 502 that abuts a rail of a rack (not shown). The bracket portion 500, 502 is fastened to the rail to mount the chassis 400 within the rack. The cable guide portion 501, 503 of the bracket structures 504, 506 restricts the fiber cables 508 exiting the cable guide 406. The fiber cables 508 from each chassis 400 in the rack pass through subsequent cable guide portions 501, 503 of adjacent chassis until the cables 508 reach a splice tray (not shown) at the top or bottom of the rack.

As shown, the fiber cables 508 extend from the modules 422 up though the cable slots 434 formed by vertical extensions 472 of the cable guide 406. The fiber cables 508 pass over the radius limiters 410 and pass out the side of the cable guide 406 over an additional radius limiter 410 at the edge of the chassis 400. From the radius limiter 410 at the edge of the chassis 400, the fiber cables 508 pass down through the cable guide portions 501 or 503 of the bracket structure 502 or 504.

Figure 35:
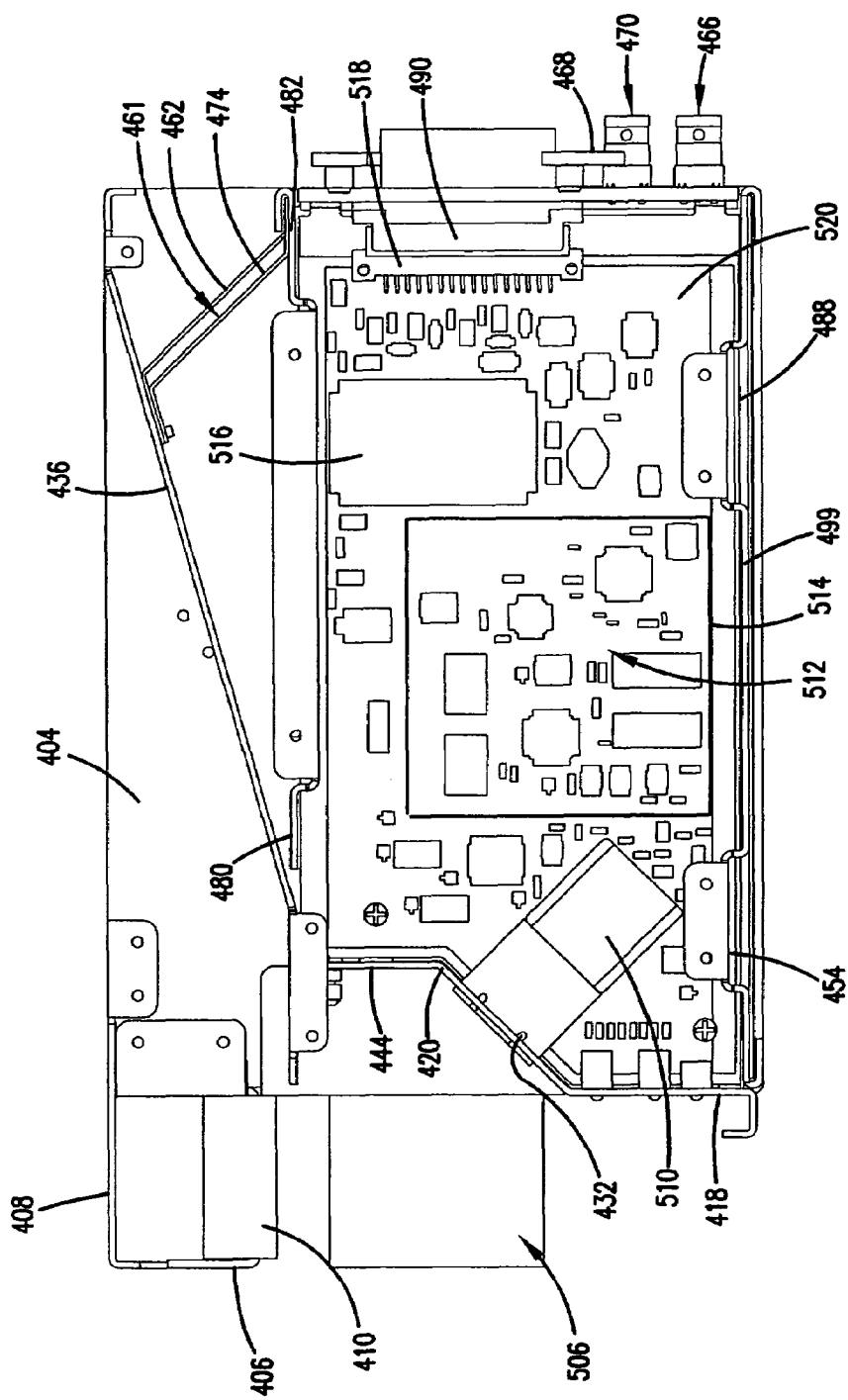
FIG. 35 is a right side view of the chassis of FIG. 23 with a right sidewall removed.

FIG. 35 is a right-side view of the chassis 400 with the right vertical sidewall 402 removed. A surface of a shielding cage 514 has also been removed to reveal additional circuitry 512 that lies beneath the cage 514 on a circuit board 520 of each module 422. The cage 514 and circuitry 512 beneath it lie directly over the recessed area 499 between the first ridge 454 and second ridge 488 of the bottom horizontal surface 476. The circuit board 520 also includes a fiber optic transceiver 510 that is positioned directly above the first ridge 454. A DC-DC converter 516 is also included on the circuit board 520 and is positioned directly above the second ridge 488. The openings 456 and 496 within the first and second ridges 454, 488 permit air to circulate passed the fiber optic transceiver 510 and DC-DC converter 516, while ventilation holes 494 in the recessed area 499 allows air to circulate over the circuitry 512.

Air is also circulated by the module 422 and through the ventilation holes 492 in the top horizontal surface 478. The modules 422 produce heat that is dissipated into the air and causes the air to warm and rise. The air may then exit out of the chassis 400 by passing beneath baffle surface 436 and out through additional baffle surfaces 462 and 474. Should flames be imposed within the chassis 400, the flames may rise through the ventilation holes 492 in the top horizontal surface 478 and the flames are directed by the baffle surface 436 toward baffles surface 474. The mesh material of surface 474 diffuses the flames, as does separation 461 and the mesh material of surface 462.

When the module 422 is fully installed in the chassis 400, a connector 518 of the module 422 engages backplane connector 490. Electrical continuity is then established between the module 422 and the input and output coaxial connectors 466, 470 on the backplane 464.

Figure 36:
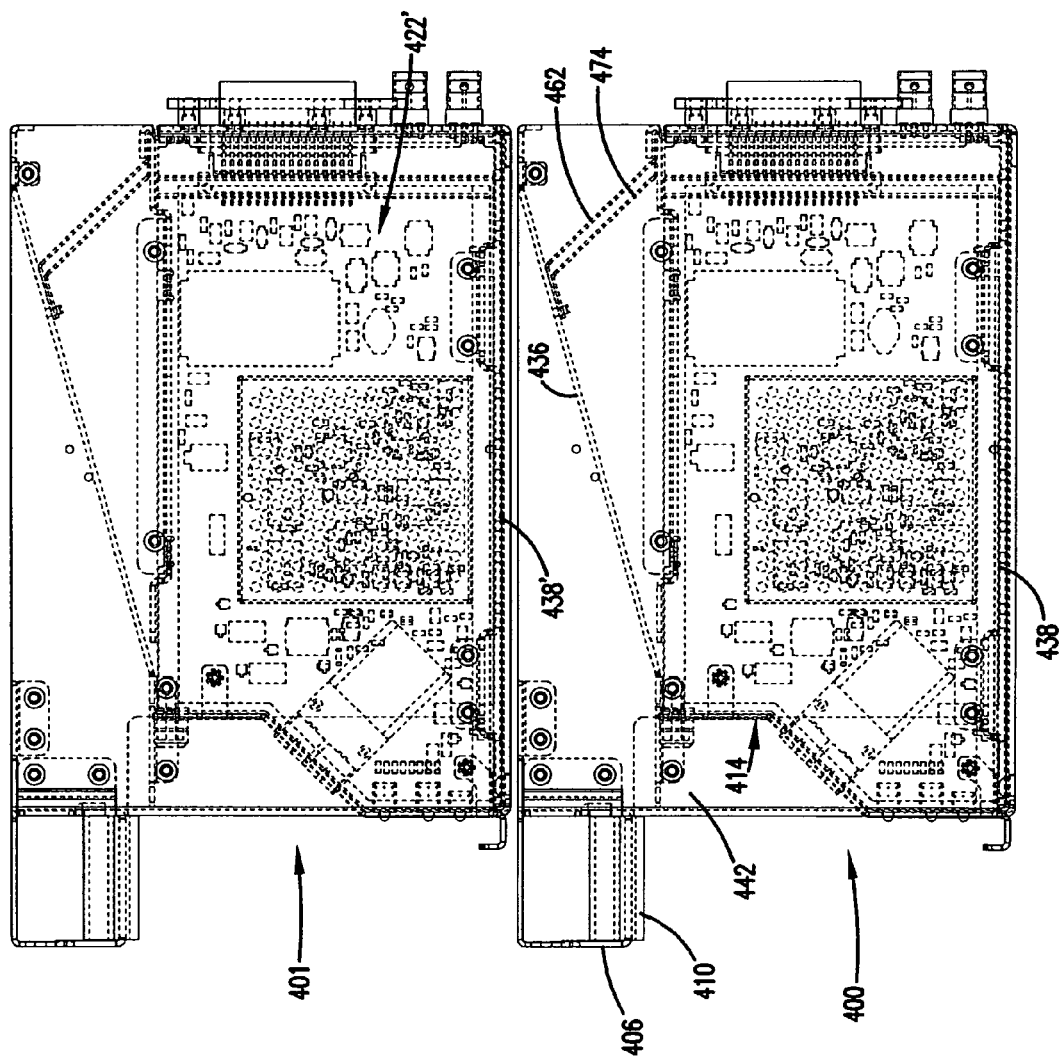
FIG. 36 is a right side hidden view, such as taken through line B-B of FIG. 29, where two chassis of the second alternative embodiment are in a stacked configuration typical of rack mounting.

FIG. 36 is a cross-sectional view of two stacked chassis 400, 401, such as through line B-B of FIG. 29, as they would be appear while mounted in a rack. Air that enters the bottom chassis 400 through the cable guide 406 and through the gap 442 provided between the cable guide 406 and modules 422 and front panel 414 passes into the area above the heat baffle surface 436. The air is then directed by the heat baffle surface 436 into the bottom horizontal surface 438' of the chassis 401 stacked atop chassis 400. As previously discussed, the bottom horizontal surface 438' is a ventilated surface such as a mesh metal with densely populated holes that allow the air to pass through. The air then passes by the modules 422' and out of the chassis 401 through the heat baffle surfaces.

FIG. 37 shows the module 422 mounted in relation to the bottom horizontal surface 476. Also visible in this view are divider wall slots 455 in the first ridge 454 and divider wall slots 457 in the second ridge 488 that receive the bottom edge of the divider walls 446. A bottom edge 522 of the circuit board 520 of the module 422 is disposed within the card slots 458 in the first ridge 454 and card slots 459 in the second ridge 488.

The fiber optic transceiver 510 is located directly over the ventilation hole 456 of the first ridge 454. The shielding cage 514 is located directly over the ventilation holes 494 of the recessed area 499. The DC-DC converter 516 is located directly over the ventilation holes 496 of the second ridge 488.

FIG. 38 shows the module 422 mounted in relation to the top horizontal surface 478 and heat baffle surface 436. A top edge 524 of the circuit board 520 is disposed in the card slot 490 in the lip 480 of the baffle surface 436. The top edge 524 of the circuit board 520 is also disposed in the card slot 486 of the recessed area 471 of the top horizontal surface 478. The shielding cage 514 and the DC-DC converter 516 are positioned directly under the ventilation holes 492 of the recessed area 471.

Figure 39:
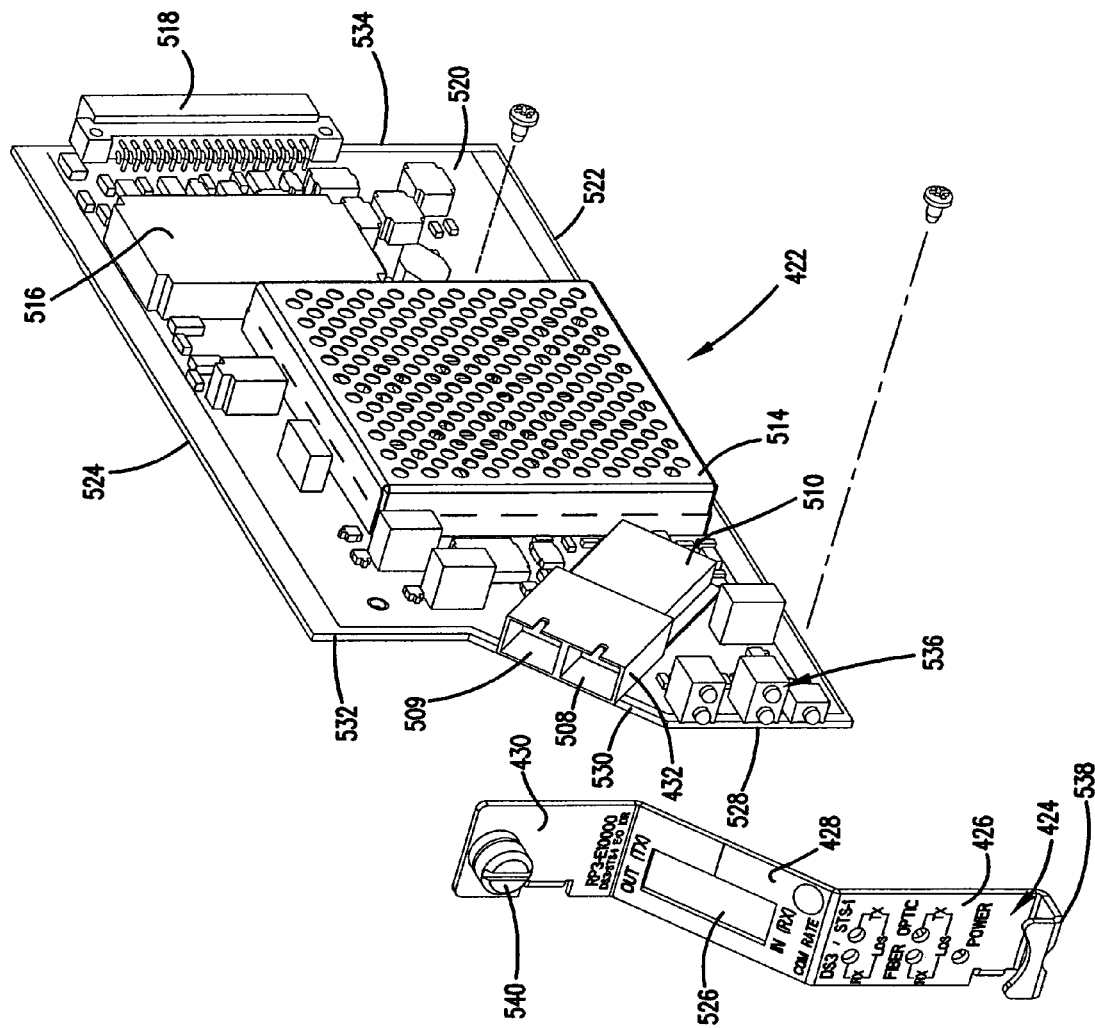
FIG. 39 is an exploded perspective view of the module of FIGS. 37 and 38.

FIG. 39 shows an exploded view of the module 422. The module 422 includes the fiber optic cable connector 432 with the input connector 508 and output connector 509. The module 422 has the connector 518 mounted along a back edge 534 of the circuit board 520. The faceplate 424 mounts along three portions 528, 530, and 532 of the front edge of the circuit board 520.

The bottom vertical portion 426 of the faceplate 424 mounts adjacent to a first vertical portion 528 of the front edge of the circuit board 520. The second portion 526 of the faceplate 424 mounts adjacent to a second portion 530 of the front edge of the circuit board 520. The second portion 530 is angled with respect to the first vertical portion 528. The third portion 430 of the faceplate 424 mounts adjacent to a third vertical portion 532 of the front edge of the circuit board 520 that is set back from the first vertical portion 528. The faceplate 424 may also have a handle portion 538.

The second portion 424 of the faceplate 424 has an aperture 526 that exposes the input 508 and output 509 connections of the fiber optic cable connector 432. The fiber optic cable connector 432 has a connection axis that is perpendicular to the second portion 530 of the front edge of the printed circuit board 520. The faceplate 424 includes a fastener 540 that may attach to the lip 488 of the baffle surface 436 of the chassis 400. The module 422 also includes visual indicator LEDs 536 that provide the visual indication of the module's operation.

FIG. 40 is a bottom front perspective view of a third alternative embodiment. The chassis 600 of FIG. 40 is configured to hold modules throughout the area between vertical sidewalls 602 and 604. The chassis 400 shown in FIG. 40 is empty but has covers 614 mounted in place of modules. The covers 614 isolate the interior when modules are not installed and include a first vertical portion 626, a second portion 628 angled with respect to the first vertical portion 626, and a third vertical portion 630 set back from the first vertical portion 626.

The chassis 600 includes a cable guide 606 having vertical extensions 626 separated to form cable slots 625. A radius limiter 610 lies between each cable slot 625. A cable guide cover 608 is also included and has vertical extensions 624 offset from the vertical extensions 626. A gap 612 is provided between the modules or covers 614 and the cable guide to permit air to pass into the area above the chassis 600. Air may also pass horizontally through cable guide 606 to reach the area above the chassis 600.

The chassis 600 has bracket structures 618, 620 that allow the chassis 600 to be mounted to a rack while guiding cables passing vertically from the chassis 600. Vertical cable guide portions 617 and 621 restrict the cable. Bracket portion 619 abuts the rail of a rack (not shown) and is mounted to the rail to hold the chassis 600 within the rack.

The chassis 600 may also include a bottom horizontal surface 616 that may be made of a metal mesh such as aluminum with densely populated openings that allow air to pass through. As shown in FIG. 41, the chassis 600 includes a heat baffle surface 622 disposed between the sidewalls 602, 604.

Figure 42:
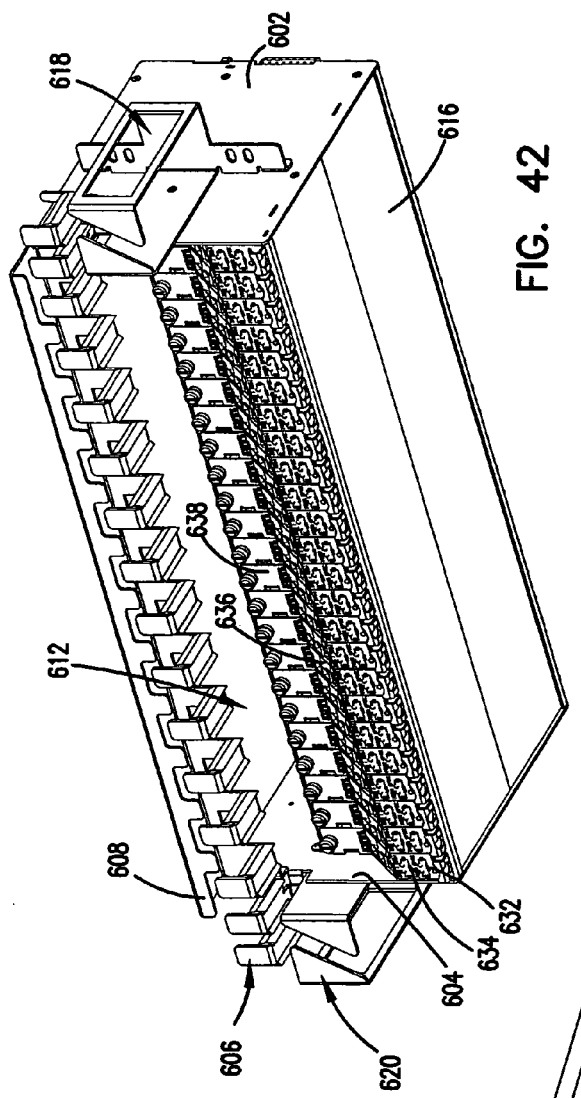
FIG. 42 is a bottom front perspective view of a loaded chassis according to the third alternative embodiment.
Figure 43:
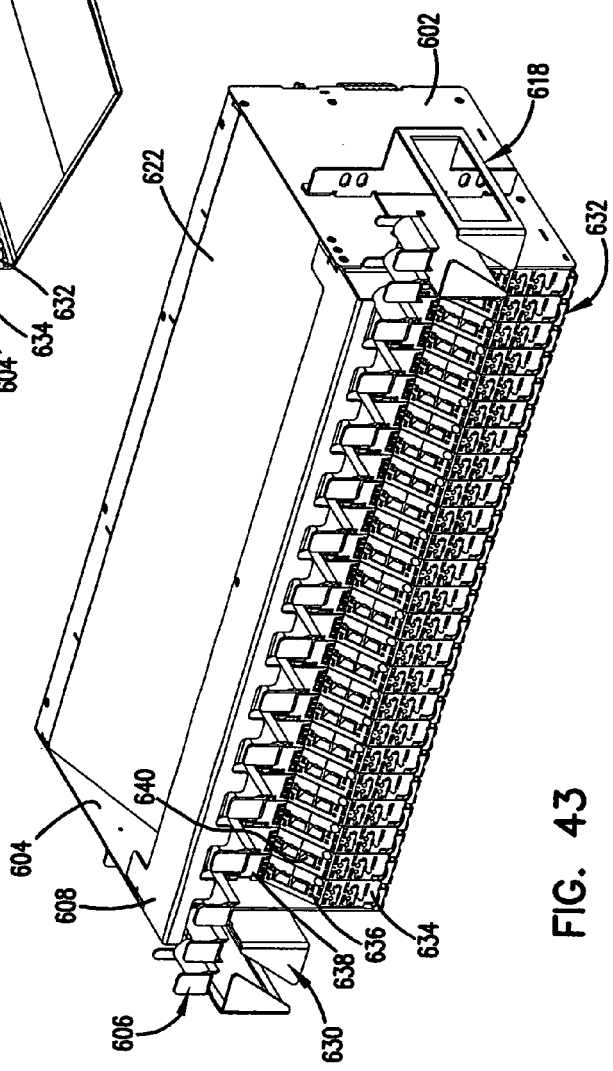
FIG. 43 is a top front perspective view of the loaded chassis of FIG. 42.

FIGS. 42 and 43 show a perspective view of the chassis 600 filed with modules 632. Modules 632 include a faceplate with three portions including a vertical portion 634, a second portion 636, and a third vertical portion 638. A fiber optic cable connector 640 is present at the second portion 636. Module 632 may be the same as module 422 shown in FIG. 39.

FIG. 44 shows a bottom rear perspective view of the chassis 600. The chassis 600 includes a second heat baffle surface 642 that extends vertically between the heat baffle surface 622 and a backplane 646. The backplane 646 has input and output coaxial connectors 648 and 650. A lexan cover 644 may cover vulnerable portions of the backplane 646 wherein conductors are exposed. Chassis ground connections 654 may also be provided to establish a chassis ground connection for the circuitry of the modules 632.

FIG. 45 is a top rear perspective view of the chassis 600. The gap 612 between the heat baffle surface 622 and the cable guide 606 can be seen. The cable guide includes a rear vertical portion 652 defining ventilation slots 651 that allow air to pass through the cable guide 606.

FIG. 46 shows a front view of the empty chassis 600. FIG. 47 shows a top view of the empty chassis 600. FIG. 48 shows a right side view of the empty chassis 600. As is visible, radius limiters 610 are provided over the bracket structure 618, 620 to prevent overbending of cables as they are directed down through the bracket structure 618, 620 from the cable guide 606. The bracket structure 618, 620 extends forward from the sidewalls to underlay the cable guide 606.

Figure 51:
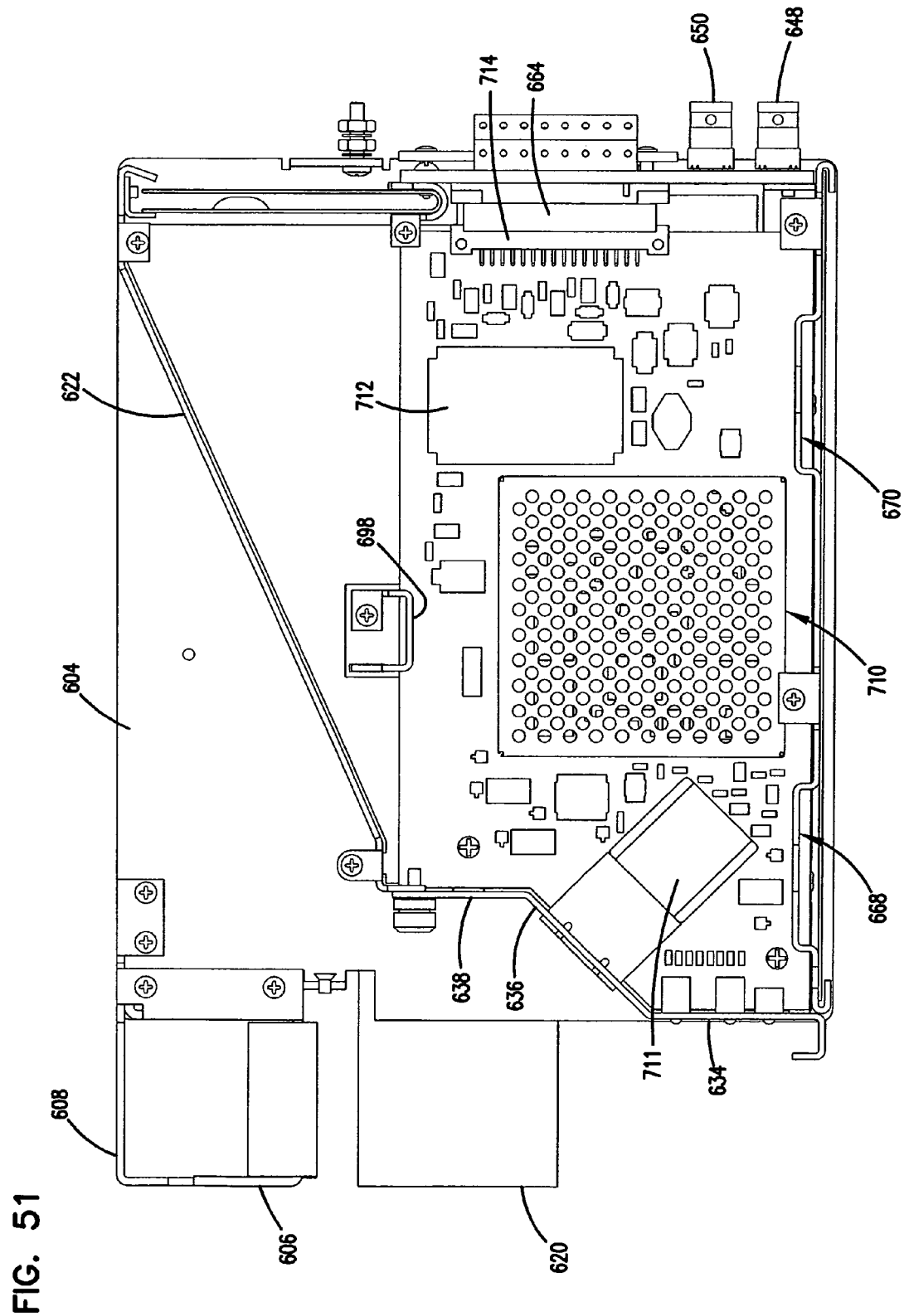
FIG. 51 is a right side view of the loaded chassis of FIG. 42 with the right sidewall removed.

FIG. 49 shows a front view of the loaded chassis 600, and FIG. 50 shows a top view of the loaded chassis 600. FIG. 51 shows a right side view of the loaded chassis 600 with the right side panel 602 removed. Modules 632 may include a fiber optic transceiver 711, a cage 710 covering media conversion circuitry, and a DC-DC converter 712. The fiber optic transceiver 711 lies over a first ridge 668 of the bottom surface 666. The cage 710 lies between the first ridge 668 and a second ridge 670 of the bottom surface 666. The DC-DC converter 712 lies above the second ridge 670.

A U-shaped channel 698 passes horizontal over the modules 632 and between the sidewalls 602, 604. The U-shaped channel 698 includes card slots discussed below that receive a top edge of the module 632 to guide it as it is inserted into the chassis 600.

Figure 52:
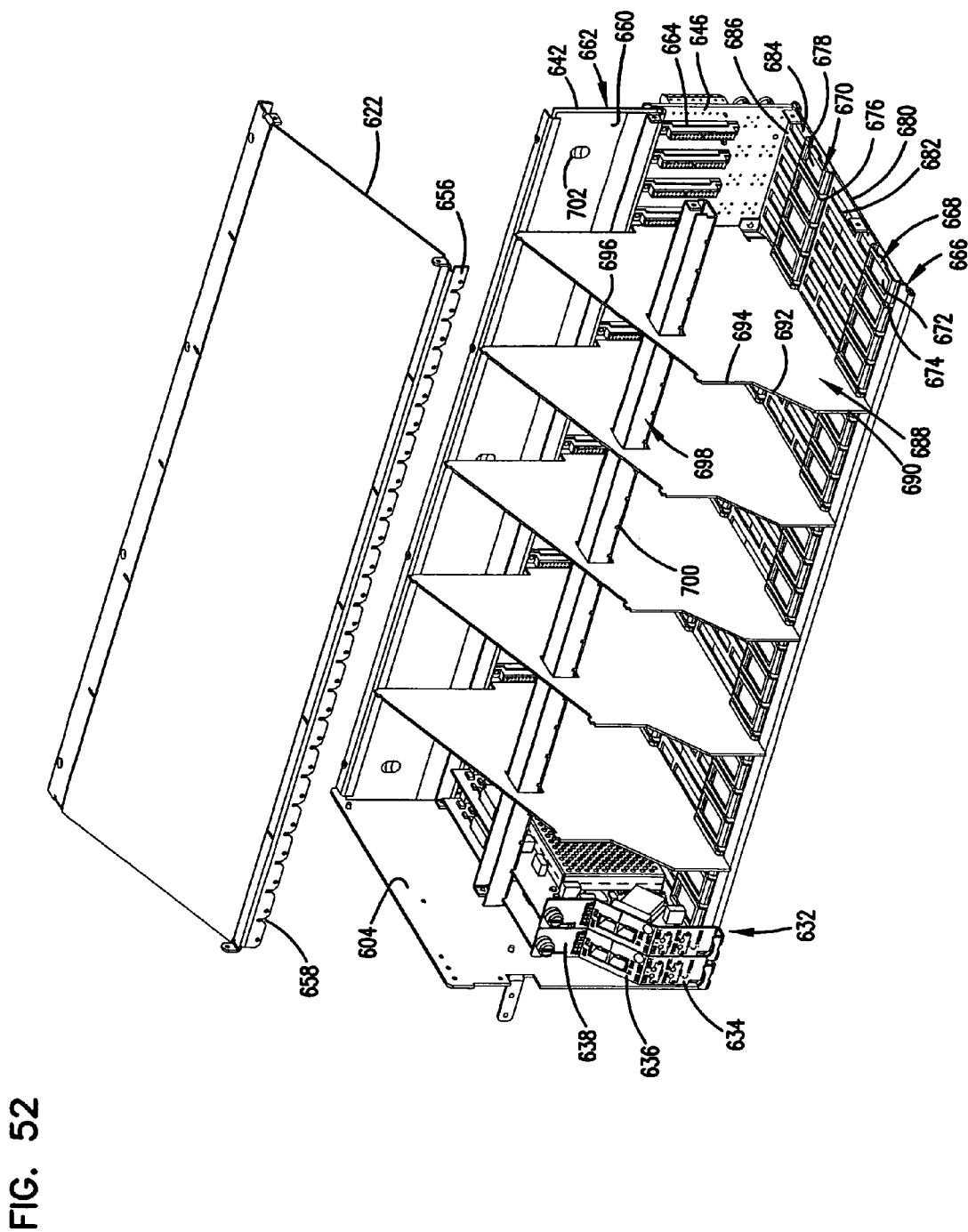
FIG. 52 is an exploded view of the chassis of the third embodiment with cable guide structures removed.

FIG. 52 shows an exploded view of the chassis 600 with the cable guide 606 and associated structures removed. The heat baffle surface 622 has a lip 656 that has card slots 658 for receiving a top edge of the modules 632. A third heat baffle surface 660 may also be included and is spaced from the heat baffle surface 642 by separation 662. Projections 702 may be included to maintain the separation 662. The heat baffle surface 642 and surface 660 may be a metal mesh material such as aluminum with densely populated openings. Furthermore, the baffle surfaces 642 and 660 may be one continuous piece of metal bent into a U shape.

Figure 54:
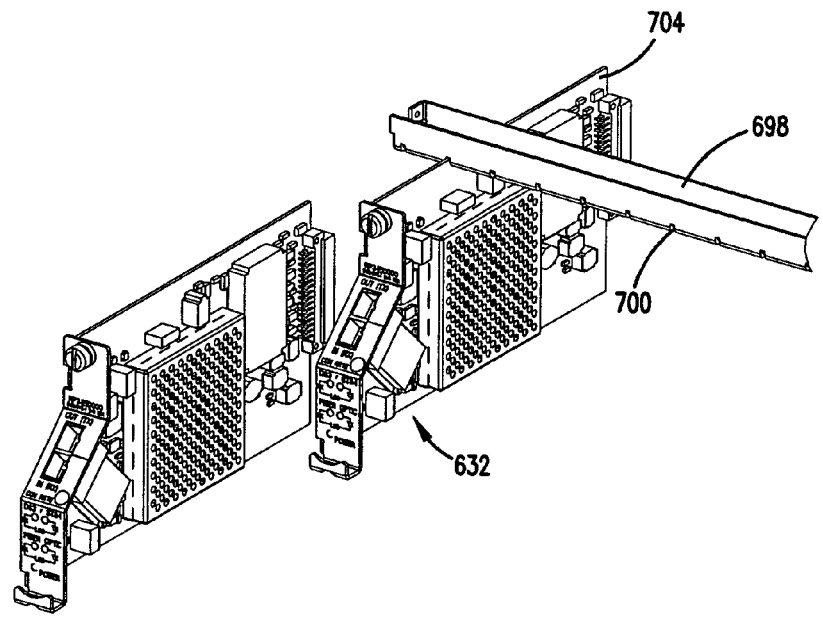
FIG. 54 is a perspective view of a module mounted with respect to a channel of the chassis of FIG. 53.

The chassis 600 includes a horizontal channel 698 that extends between the two sidewalls 602, 604. The horizontal channel 698 may be a metal such as cold-rolled steel or aluminum. The horizontal channel 698 includes horizontal card slots 700 that extend parallel to the plane of the sidewalls 602, 604. As shown in FIG. 54, a top edge 704 of the modules 632 is disposed within the card slots 700.

The chassis 600 also includes a horizontal surface 666 that includes a first ridge 668 and a second ridge 670. A recessed area 680 is located between the first ridge 668 and the second ridge 670. The second ridge 678 and the back edge of the horizontal surface 666 define another recessed area 684 that includes openings 686.

Figure 55:
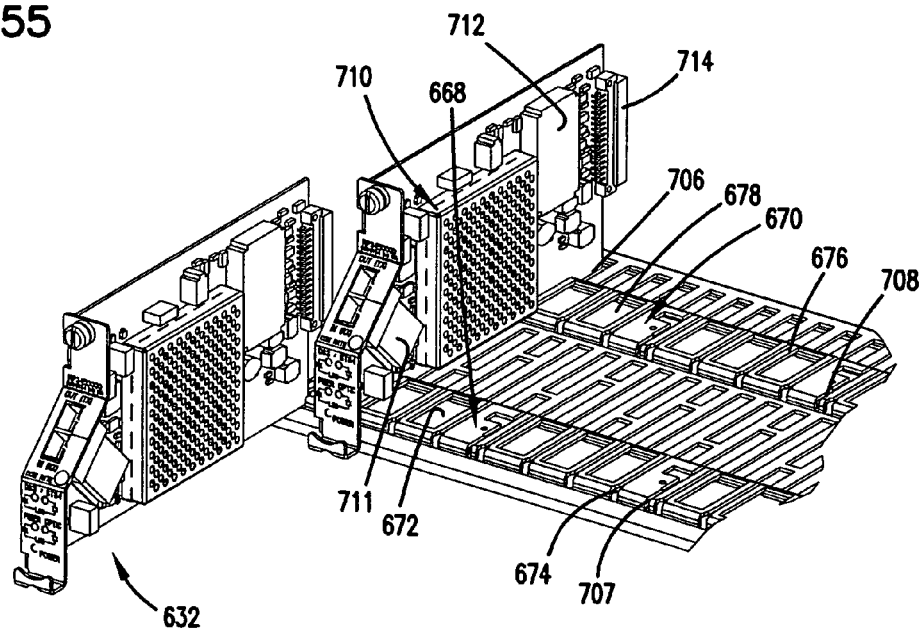
FIG. 55 is a perspective view of the module mounted with respect to a bottom horizontal surface of the chassis of FIG. 53.

The first ridge 668 includes card slots 674 and ventilation holes 672 between each adjacent pair of card slots 674. Recessed area 680 includes ventilation holes 682. The second ridge 670 includes card slots 676 and ventilation holes 678 between each adjacent pair of card slots 676. As shown in FIG. 55, the modules 632 have a bottom edge 706 that fits within the card slot 674 of the first ridge 668 and card slot 676 of the second ridge 670.

The module 632 also includes the cage 710 covering circuitry, the DC-DC converter 712, and the fiber optic transceiver 711. As was discussed with reference to FIG. 51, when the module 632 is fully installed in the chassis 600, the cage 710 lies between the first ridge 668 and second ridge 670 and above the recessed area 680 and openings 682. The DC-DC converter 712 lies over the second ridge 670 and opening 678. The fiber optic transceiver 711 lies over the first ridge 668 and opening 672. The module 632 also includes a connector 714 on the back edge that engages the connector 664 of the backplane 646.

As shown in FIG. 52, divider walls 688 are included in the chassis 600 to compartmentalize the chassis 600. The divider walls 688 fit within divider slots 707 of the first ridge 668 and divider slots 708 of the second ridge 670 that are visible in FIG. 55. The divider walls 688 include a vertical edge 690, a vertical edge 694 set back from the vertical edge 690, an angled edge 692 interconnected the vertical edges 690, 694, and another angled edge 696 that is parallel to the heat baffle surface 622.

Figure 53:
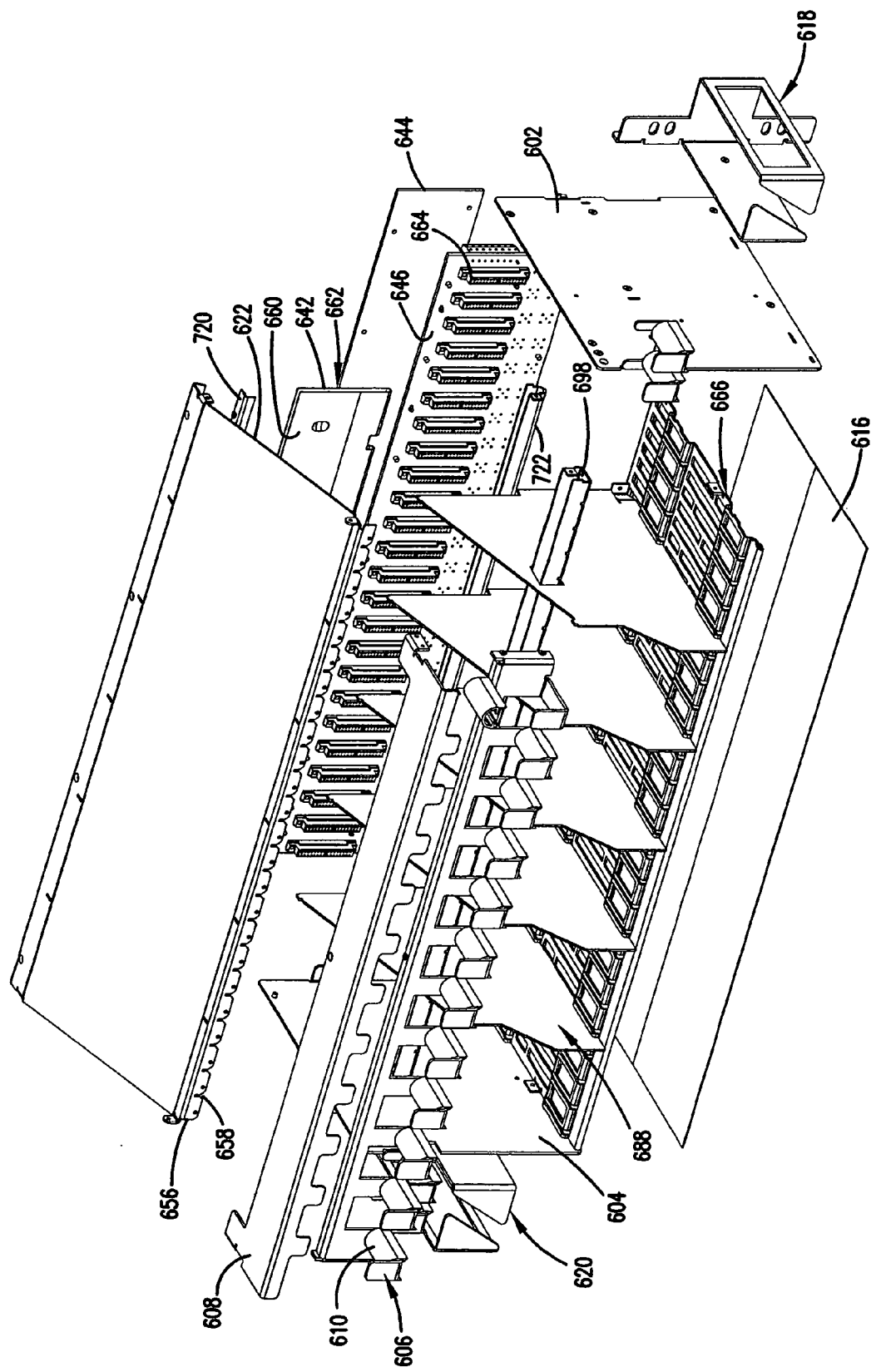
FIG. 53 is an exploded view of the chassis including the cable guide structures.

A backplane 646 is included at the rear of the chassis 600 and includes connectors 664 for mating to modules 632. The mesh heat baffle surfaces 642, 660 span a gap between the top of the backplane 646 and the solid heat baffle surface 622. As shown in FIG. 53, the mesh heat baffle surfaces 642, 660 connect to the backplane 646 through a U-shaped channel 722 and connect to the solid baffle surface 622 through an L-shaped bar 720. As can be seen in FIG. 53, the mesh bottom surface 616 underlays the bottom surface 666. In this embodiment, no top horizontal surface is included so that increased ventilation out of the heat baffle is provided for the increased density of modules 632.

Figure 56:
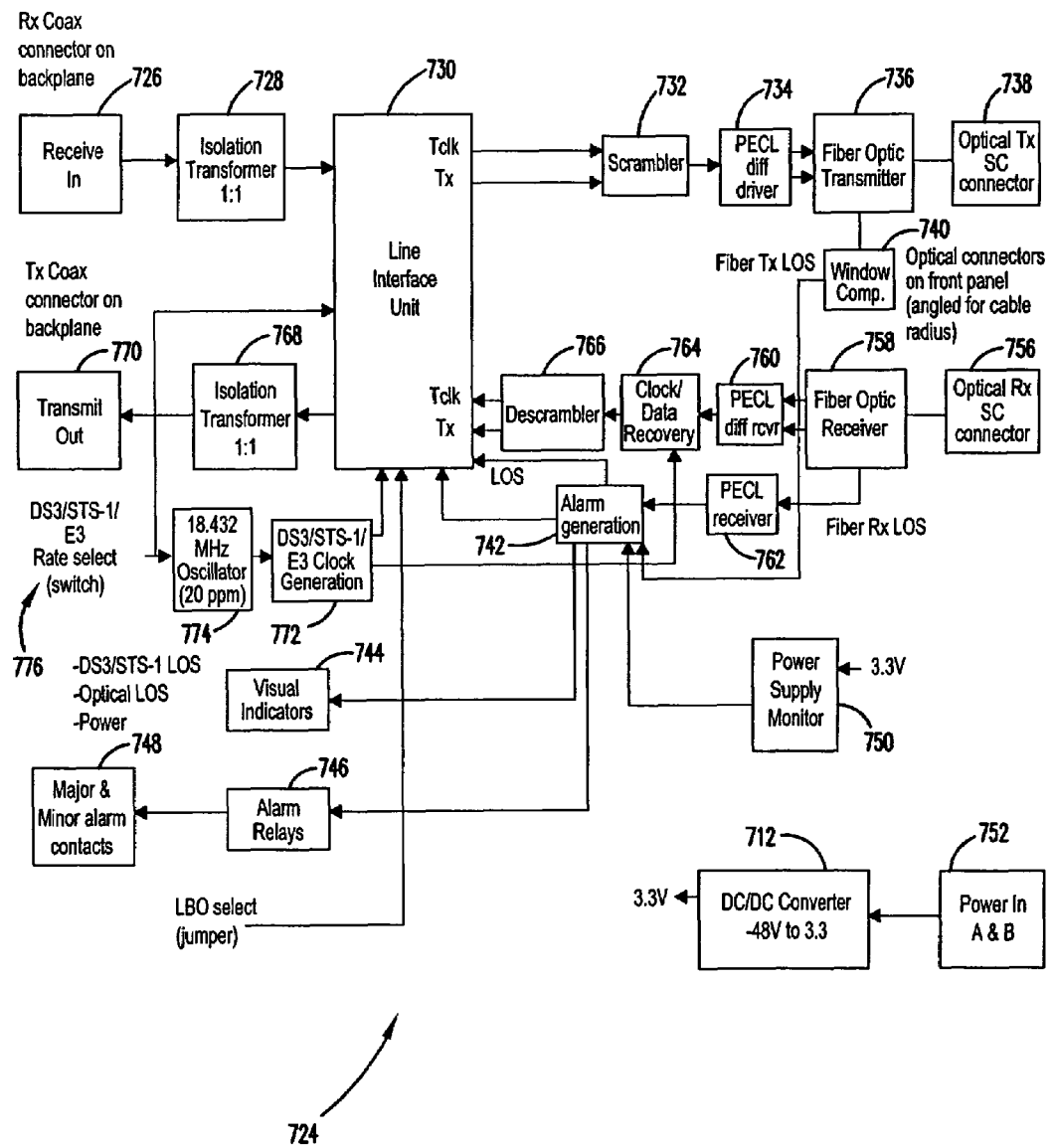
FIG. 56 is a detailed block diagram of alternative media conversion circuitry of one embodiment.

FIG. 56 shows a detailed block diagram of alternative media conversion circuitry 724 that operates at multiple data rates. As shown, three data rates are selectable including DS3, STS-1, and European (E3) (34.368 Mbps). Other data rates are possible as well. The alternative circuitry 724 includes most of the circuitry included in the previous embodiment of FIG. 21 such as the LIU 730, coaxial jacks 726, 770, isolation transformers 728, 768, visual indicators 744, alarm relays 746, alarm contacts 748, power jack 752, DC-DC converter 712, supply monitor 750, alarm generation 742, PECL differential driver 734, PECL differential receiver 760, PECL receiver 762, window comparator 740, fiber optic transmitter 736, fiber optic receiver 758, and fiber optic jacks 738, 756. These components function as discussed with reference to the previous embodiment.

This embodiment also includes a single oscillator 774 rather than multiple ones as previously discussed. A clock generator 722 such as the Cypress CY2908F7I employing a phase locked loop is used to selectively generate the frequency corresponding to the desired data rate to be converted. The oscillator 774 supplies a reference signal to the clock generator 722. The clock generator 772 supplies the reference frequency to the LIU 730 and a clock and data recovery circuit 764 such as the Micrel SY87700LHI. A switch 776 that is user manipulated is connected to the LIU and clock generator 772 to set the data rate of the conversion.

This embodiment also employs a scrambler 732 and a descrambler 766. The scrambler 732 employs a scheme to create sufficient transitions in the TTL stream so that the clock is always recoverable, even when the NRZ data is a continuous stream of ones or zeros. Thus, the scrambler 732 effectively scrambles the signal by creating the transitions. The scrambler 732 receives the TTL NRZ signal from the LIU 730 and feeds the scrambled TTL signal to the PECL differential driver 734.

Likewise, the descrambler 766 recovers the NRZ data from a scrambled TTL signal produced by the clock and data recovery circuit 764. The descrambler 766 feeds the descrambled TTL NRZ signal to the LIU 730. The scrambler 732 and descrambler 766 may be included as part of the functionality of the PLD, such as the Atmel ATF1504ASV-15AI44, that also performed the alarm generation.

While the invention has been particularly shown and described with reference to preferred embodiments thereof, it will be understood by those skilled in the art that various other changes in the form and details may be made therein without departing from the spirit and scope of the invention.

What is claimed is:

1. A telecommunications module, comprising:
   a circuit board having a first edge;
   a fiber optic cable connector mounted to the circuit board along the first edge, the fiber optic cable connector having a connection axis forming an angle with the first edge and at least a portion of the fiber optic cable connector extending beyond the first edge;
   a faceplate mounted to the circuit board, the faceplate having a first portion substantially parallel to the first edge, a second portion substantially parallel to the connection axis of the fiber optic cable connector, and a third portion substantially perpendicular to the connection axis of the fiber optic cable connector; and
   circuitry mounted to the circuit board for converting electrical signals to optical signals or optical signals to electrical signals.

2. The telecommunications module of claim 1, wherein the faceplate includes a mounting arm extending from the second portion or the third portion to the circuit board.

3. The telecommunications module of claim 2, wherein the faceplate further includes a second mounting arm extending from the first portion to the circuit board.

4. The telecommunications module of claim 1, wherein the third portion has an aperture, the module further comprising a fiber optic cable received by the fiber optic cable connector through the aperture.

5. The telecommunications module of claim 1, wherein the second portion interconnects the first portion to the third portion.

6. The telecommunications module of claim 1, wherein the circuitry is configured to convert electrical signals of a first data rate or a second data rate to optical signals and to convert optical signals to electrical signals of a first data rate or a second data rate.

7. A telecommunications module, comprising:
   a circuit board containing circuitry for transferring signals, the circuit board having a first edge;
   a fiber optic cable connector mounted to the circuit board along the first edge, the fiber optic cable connector having a connection axis forming an angle with the first edge;
   a shell including first and second sidewalls separated by first and second horizontal surfaces and by a faceplate, wherein the circuit board and the fiber optic cable connector are mounted to the shell between the first and second sidewalls and between the first and second horizontal surfaces, and wherein the faceplate has a first portion substantially parallel to the first edge of the circuit board, a second portion substantially parallel to the connection axis of the fiber optic cable connector, and a third portion substantially perpendicular to the connection axis of the fiber optic cable connector and wherein the first and second sidewalls abut the first portion, second portion, and third portion of the faceplate; and a connector mounted to the printed circuit board and extending beyond the shell.

8. The telecommunications module of claim 7, wherein the third portion has an aperture, the module further comprising a fiber optic cable received by the fiber optic cable connector through the aperture.

9. The telecommunications module of claim 7, wherein the second portion interconnects the first portion to the third portion.

10. The telecommunications module of claim 7, wherein the shell further comprises a vertical surface opposite the faceplate and the circuit board is disposed between the faceplate and the second vertical surface with the second vertical surface including an aperture, and wherein the connector extends through the aperture of the second vertical surface.

11. The telecommunications module of claim 7, wherein the circuitry is configured to convert electrical signals to optical signals and to convert optical signals to electrical signals.

12. A telecommunications module, comprising:
a circuit board containing circuitry for transferring signals, the circuit board having a first edge with a first portion, a second portion, and a third portion;
a fiber optic cable connector mounted to the circuit board along the second portion, the fiber optic cable connector having a connector axis perpendicular to the second portion, the second portion being angled with respect to the first portion and the third portion, the second portion interconnecting the first portion to the third portion, the first portion and the third portion being parallel but within a different spatial plane.

13. The telecommunications module of claim 12, further comprising:
a faceplate mounted to the circuit board, the faceplate having a first portion parallel to and aligned with the first portion of the circuit card, a second portion parallel to and aligned with the second portion of the circuit card, and a third portion parallel to and aligned with the third portion.

14. The telecommunications module of claim 13, wherein the second portion of the faceplate has an aperture, the module further comprising a fiber optic cable received by the fiber optic cable connector through the aperture.

15. The telecommunications module of claim 13, further comprising a first mounting arm extending from the first portion to the printed circuit board and a second mounting arm extending from the third portion to the printed circuit board.

16. The telecommunications module of claim 13, wherein the circuitry is configured to convert electrical signals to optical signals and to convert optical signals to electrical signals.

17. A telecommunications module comprising:
a fiber optical connector; and
circuitry connected to the optical connector, the circuitry being configured to selectively convert electrical signals having a first data rate or electrical signals having a second rate different than the first rate to optical signals.

18. The telecommunications module of claim 17, wherein the circuitry includes a reference signal generator configured to provide at least two reference signals having different frequencies, wherein a first of the at least two frequencies corresponds to the first data rate and a second of the at least two frequencies corresponds to the second data rate.

19. The telecommunications module of claim 18, wherein the reference signal generator includes a first oscillator of the first of the at least two frequencies and includes a second oscillator of the second of the at least two frequencies.

20. The telecommunications module of claim 18, wherein the reference signal generator includes a first oscillator electrically connected to a first phase locked loop, the first phase locked loop providing an output of the first of the at least two frequencies, the reference signal generator further comprising a second phase locked loop, the second phase locked loop providing an output of the second of the at least two frequencies.

21. The telecommunications module of claim 17, further comprising:
a switch connected to the reference signal generator, the switch enabling the reference signal generator to provide the first frequency when in a first position and enabling the reference signal generator to provide the second frequency when in a second position.

22. The telecommunications module of claim 17, further comprising:
a printed circuit board, wherein the fiber optic cable connector and circuitry is mounted to the printed circuit board; and
a faceplate mounted to the printed circuit board, the faceplate having an aperture surrounding the fiber optic cable connector.

23. A telecommunications module comprising:
a fiber optical connector; and
circuitry connected to the optical connector, the circuitry being configured to selectively convert optical signals to electrical signals having a first data rate or to electrical signals having a second data rate different than the first data rate.

24. The telecommunications module of claim 23, wherein the circuitry includes a first recovery circuit configured to recover clock and data information for a first data rate from an intermediate electrical signal created by the circuitry, and wherein the circuitry includes a second recovery circuit configured to recover clock and data information for a second data rate different than the first data rate from the intermediate electrical signal.

25. The telecommunications module of claim 24, further comprising:
a switch connected to the first and second recovery circuits, the switch enabling the first recovery circuit to operate when in a first position and enabling the second recovery circuit to operate when in a second position.

26. The telecommunications module of claim 23, further comprising:
a printed circuit board, wherein the fiber optic cable connector and circuitry is mounted to the printed circuit board; and
a faceplate mounted to the printed circuit board, the faceplate having an aperture surrounding the fiber optic cable connector.

* * * * *

UNITED STATES PATENT AND TRADEMARK OFFICE
CERTIFICATE OF CORRECTION

| | | |
|---|---|---|
| PATENT NO. | : 7,668,430 B2 | Page 1 of 1 |
| APPLICATION NO. | : 11/000363 | |
| DATED | : February 23, 2010 | |
| INVENTOR(S) | : McClellan et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1100 days.

Signed and Sealed this

Seventh Day of December, 2010

David J. Kappos
*Director of the United States Patent and Trademark Office*